(12) United States Patent
Jo

(10) Patent No.: US 10,253,937 B2
(45) Date of Patent: Apr. 9, 2019

(54) LAMP FOR VEHICLE AND VEHICLE COMPRISING THE SAME

(71) Applicant: LG Electronics Inc., Seoul (KR)

(72) Inventor: Juung Jo, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 15/856,727

(22) Filed: Dec. 28, 2017

(65) Prior Publication Data

US 2018/0372290 A1   Dec. 27, 2018

(30) Foreign Application Priority Data

Jun. 21, 2017  (KR) .................. 10-2017-0078773

(51) Int. Cl.
| | |
|---|---|
| *F21V 5/00* | (2018.01) |
| *F21S 41/141* | (2018.01) |
| *H01L 25/075* | (2006.01) |
| *H01L 33/50* | (2010.01) |
| *H01L 33/62* | (2010.01) |

(Continued)

(52) U.S. Cl.
CPC .......... *F21S 41/141* (2018.01); *F21S 41/285* (2018.01); *F21S 41/657* (2018.01); *F21S 43/14* (2018.01); *F21S 43/26* (2018.01); *H01L 25/0753* (2013.01); *H01L 25/0756* (2013.01); *H01L 33/507* (2013.01); *H01L 33/508* (2013.01);

(Continued)

(58) Field of Classification Search
CPC ...... F21S 41/141; F21S 41/285; F21S 41/657; F21S 43/14; F21S 43/26; H01L 33/508; H01L 33/62; H01L 33/507; H01L 25/0753; H01L 25/0756; F21Y 2115/10; B60Q 1/20

See application file for complete search history.

(56) References Cited

U.S. PATENT DOCUMENTS

| | | | |
|---|---|---|---|
| 8,408,775 B1 * | 4/2013 | Coleman | F21V 7/04 362/602 |
| 8,750,671 B1 * | 6/2014 | Kelly | F21V 3/049 362/335 |

(Continued)

FOREIGN PATENT DOCUMENTS

| | | |
|---|---|---|
| DE | 19922176 | 11/2000 |
| EP | 2671756 | 12/2013 |

(Continued)

OTHER PUBLICATIONS

Korean Office Action for Korea Patent Application No. 10-2017-0078773 dated May 11, 2018, 5 pages.

(Continued)

*Primary Examiner* — Ali Alavi

(74) *Attorney, Agent, or Firm* — Fish & Richardson P.C.

(57) ABSTRACT

A lamp for a vehicle includes a light generation unit, and a first lens configured to change an optical path of light generated by the light generation unit. The light generation unit includes a flexible array, and a plurality of groups of micro Light Emitting Diode (LED) chips disposed on the flexible array, the plurality of groups of micro LED chips includes a first group of micro LED chips and a second group of micro LED chips, and a shape of a first micro LED chip in the first group of micro LED chips is different from a shape of a second micro LED chip in the second group of micro LED chips.

20 Claims, 21 Drawing Sheets

(51) Int. Cl.
    *H01L 33/60*     (2010.01)
    *F21S 43/14*     (2018.01)
    *F21S 41/20*     (2018.01)
    *F21S 43/20*     (2018.01)
    *F21S 41/657*     (2018.01)
    *B60Q 1/20*     (2006.01)
    *F21Y 115/10*     (2016.01)

(52) U.S. Cl.
    CPC .............. *H01L 33/60* (2013.01); *H01L 33/62* (2013.01); *B60Q 1/20* (2013.01); *F21Y 2115/10* (2016.08)

(56) References Cited

U.S. PATENT DOCUMENTS 8,761,565 B1 * 6/2014 Coleman ................. F21V 5/002
    362/335

8,948,564 B1 * 2/2015 Sherman ................... F21K 9/61
    362/335
2013/0062631 A1   3/2013  Liu
2015/0003083 A1   1/2015  Uehara

FOREIGN PATENT DOCUMENTS

| | | |
|---|---|---|
| EP | 3034932 | 6/2016 |
| GB | 2530307 | 3/2016 |
| JP | 2000100219 | 4/2007 |
| JP | 2012527118 | 11/2012 |
| JP | 2015032547 | 2/2015 |
| WO | WO 2016209792 | 12/2016 |

OTHER PUBLICATIONS

Extended European Search Report in European Application No. 18178855.5, dated Nov. 9, 2018, 8 pages.

* cited by examiner

SIDE SURFACE

TOP SURFACE

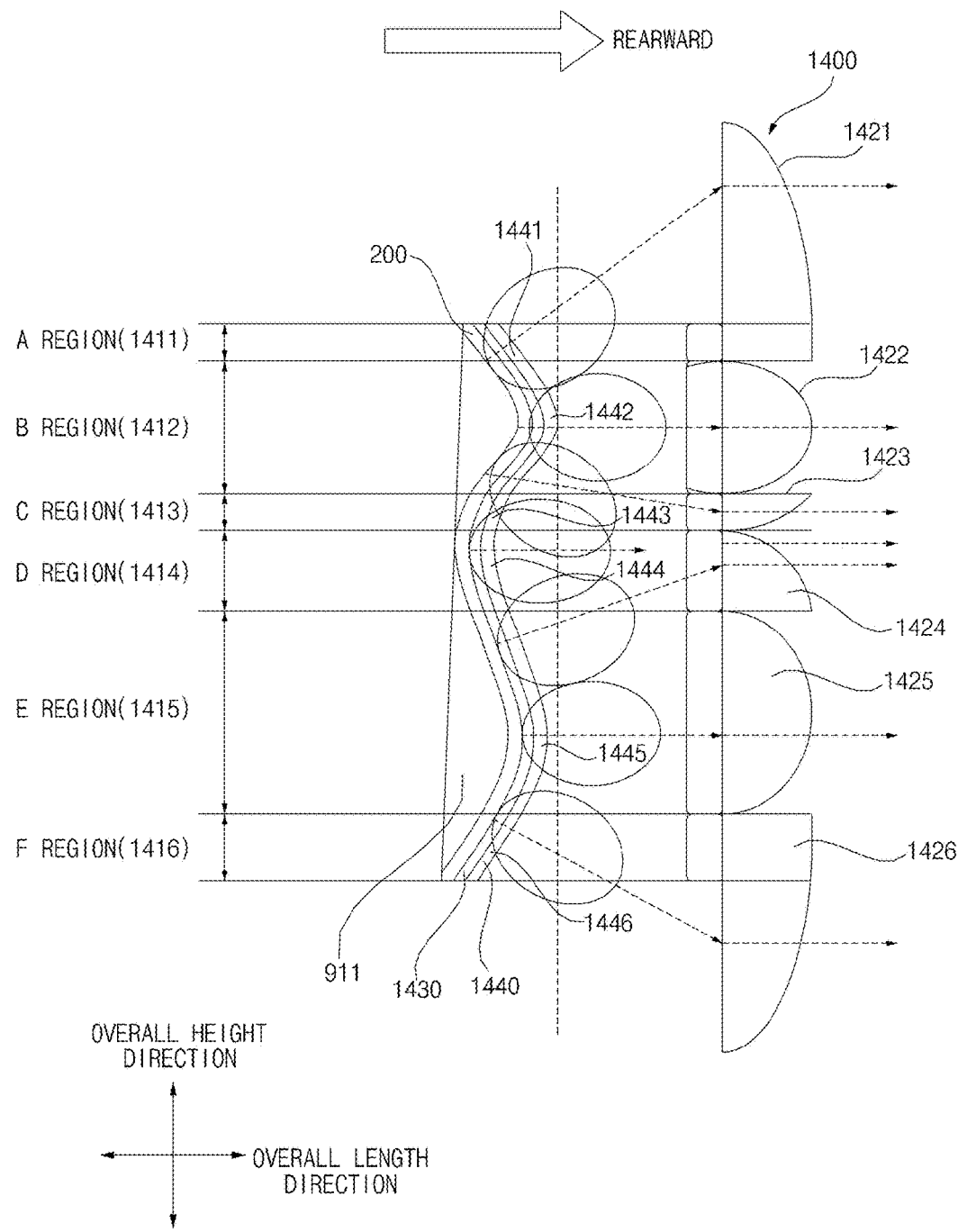

LAMP FOR VEHICLE AND VEHICLE COMPRISING THE SAME

CROSS-REFERENCE TO RELATED APPLICATION

This application claims the priority benefit of Korean Patent Application No. 10-2017-0078773, filed on Jun. 21, 2017, in the Korean Intellectual Property Office, the disclosure of which is incorporated herein by reference.

FIELD

The present disclosure relates to a lamp for a vehicle, and a vehicle having a lamp.

BACKGROUND

A vehicle is an apparatus that a user can ride in a direction. An example of a vehicle may be an automobile.

The vehicle may include lamps. For example, the vehicle may include a head lamp, a rear combination lamp, and a fog lamp.

The lamps for a vehicle may be classified as lamps for providing visibility for a driver (e.g., a head lamp and a fog lamp), and lamps for notifying a signal (e.g., a rear combination lamp).

A microchip or a chip (a small electronic device), may be used as a light source of the lamps provided in a vehicle.

Recently, there have been efforts to utilize a plurality of micro Light Emitting Diode (LED) chips as light sources of the lamps for a vehicle.

In some cases, a light source used in a vehicle lamp may be fixed to a configuration and has a limited freedom of design.

SUMMARY

One object of the present disclosure may be to provide a lamp for a vehicle, which includes a flexible array where a plurality of micro LED chips is disposed.

Another object of the present disclosure may be to provide a vehicle including the lamp.

Objects of the present disclosure should not be limited to the aforementioned objects and other unmentioned objects will be clearly understood by those skilled in the art from the following description.

According to one aspect of the subject matter described in this application, a lamp for a vehicle includes a light generation unit, and a first lens configured to change an optical path of light generated by the light generation unit. The light generation unit includes a flexible array, and a plurality of groups of micro Light Emitting Diode (LED) chips disposed on the flexible array, the plurality of groups of micro LED chips include a first group of micro LED chips and a second group of micro LED chips, and a shape of a first micro LED chip in the first group of micro LED chips is different from a shape of a second micro LED chip in the second group of micro LED chips.

Implementations according to this aspect, the first group of micro LED chips may be configured to output light in a first direction, and the second group of micro LED chips may be configured to output light in a second direction that is different from the first direction. In some examples, the flexible array may be divided into a plurality of regions according to a bending curvature of each region, in which the plurality of regions may include a first region and a second region, and a shape of a micro LED chip in the first region is different from a shape of a micro LED chip in the second region. In some examples, the first region may be curved to have a first curvature, and the second region may be curved to have a second curvature that exceeds the first curvature.

In some examples, the first micro LED chip in the first group of micro LED chips may have a first shape and be disposed in the first region, and the second micro LED chip in the second group of micro LED chips may have a second shape and be disposed in the second region.

In some implementations, the second micro LED chip in the second group of micro LED chips may include a body, and a reflective layer disposed on the body. In some examples, a side surface of the body may form a tilting angle with respect to a direction perpendicular to the reflective layer. The tilting angle may be determined according to the second curvature.

In some examples, the flexible array may include a phosphor layer that covers the plurality of groups of micro LED chips. For example, a thickness of the phosphor layer may be thinner at a center of the phosphor layer than a periphery of the phosphor layer. In some examples, the flexible array may further include a first region that is curved to have a first curvature, and a second region that is curved to have a second curvature that exceeds the first curvature. The thickness of the phosphor layer may be determined based on the first curvature and the second curvature.

In some examples, the first micro LED chip in the first group of micro LED chips may have a first shape and is disposed in the first region, and the second micro LED chip in the second group of micro LED chips has a second shape and is disposed in the second region. The phosphor layer may include a first phosphor area configured to change a wavelength of light generated by the first micro LED chip included in the first group, and a second phosphor area configured to change a wavelength of light generated by the second micro LED chip included in the second group. In this case, a thickness of the first phosphor area may be greater than a thickness of the second phosphor area.

In some implementations, the lamp may further include a second lens disposed between the first lens and the light generation unit, where the second lens has an optical shape determined according to a bent shape of the flexible array. In some examples, the optical shape of the second lens may be determined further based on shapes of the plurality of groups of micro LED chips. The optical shape of the second lens is convex or concave based on a curvature of the flexible array.

In some implementations, the lamp may further include a light refracting layer that includes a medium having a refractive index greater than a refractive index of air, and an air gap defined between the light generation unit and the light refracting layer. The light refracting layer may be curved based on a bent shape of the flexible array. In some examples, the flexible array may include a plurality of sub-arrays, and each group of the plurality of groups of micro LED chips may be disposed on a sub-array among the plurality of sub-arrays. The sub-array may have a different shape from a shape of a second sub-array among the plurality of sub-arrays.

According to another aspect of the subject matter, a vehicle includes the lamp that includes one or more of the features described above.

The details of other implementations are included in the following description and the accompanying drawings.

The implementations of the present disclosure have one or more effects as follows.

First, as a flexible array is provided, it may increase freedom of design of a lamp for a vehicle.

Second, as micro Light Emitting Diodes (LEDs) have different shapes on a flexible array due to bending of the flexible array, it may be possible to enhance light intensity.

Third, as a phosphor layer is provided with various thickness based on bending of the flexible array, it may be possible to decrease luminous intensity deviation and color deviation.

Fourth, as a second lens having an optical shape based on bending of the flexible array is provided, it may be possible to improve light distribution efficiency.

Effects of the present disclosure should not be limited to the aforementioned effects and other unmentioned effects will be clearly understood by those skilled in the art from the claims.

BRIEF DESCRIPTION OF THE DRAWINGS

FIG. 14B is a diagram illustrating an example light refracting layer and an example air gap.

DETAILED DESCRIPTION

Figure 1:
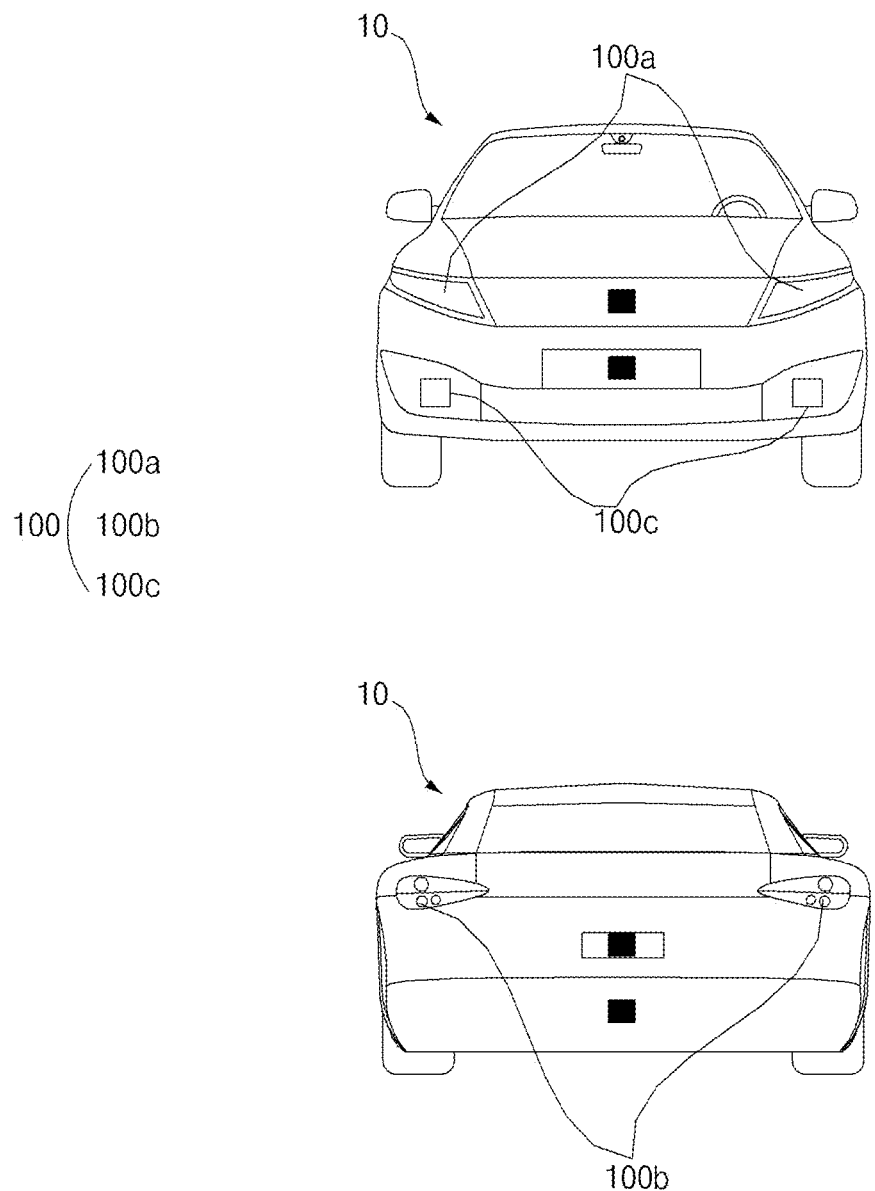
FIG. 1 is a diagram illustrating an example exterior appearance of an example vehicle.

The implementations disclosed in the present specification will be described in detail with reference to the accompanying drawings, and the same or similar elements are denoted by the same reference numerals even though they are depicted in different drawings and redundant descriptions thereof will be omitted.

A vehicle as described in this specification may include an automobile, a motorcycle, and other types of vehicles. Hereinafter, a description will be given based on an automobile.

A vehicle as described in this specification may include all of an internal combustion engine vehicle including an engine as a power source, a hybrid vehicle including both an engine and an electric motor as a power source, and an electric vehicle including an electric motor as a power source.

In the following description, "the left side of the vehicle" refers to the left side in the forward driving direction of the vehicle, and "the right side of the vehicle" refers to the right side in the forward driving direction of the vehicle.

FIG. 1 is a diagram illustrating an example exterior appearance of an example vehicle.

Referring to FIG. 1, a vehicle 10 may include a lamp 100 for vehicle.

The lamp 100 may include a head lamp 100a, a rear combination lamp 100b, and a fog lamp 100c.

The lamp 100 may further include a room lamp, a turn signal lamp, a daytime running lamp, a back lamp, and a positioning lamp.

The term "overall length" means the length from the front end to the rear end of the vehicle 10, the term "overall width" means the width of the vehicle 10, and the term "overall height" means the height from the bottom of the wheel to the roof. In the following description, the term "overall length direction L" may mean the reference direction for the measurement of the overall length of the vehicle 10, the term "overall width direction W" may mean the reference direction for the measurement of the overall width of the vehicle 10, and the term "overall height direction H" may mean the reference direction for the measurement of the overall height of the vehicle 10.

Figure 2:
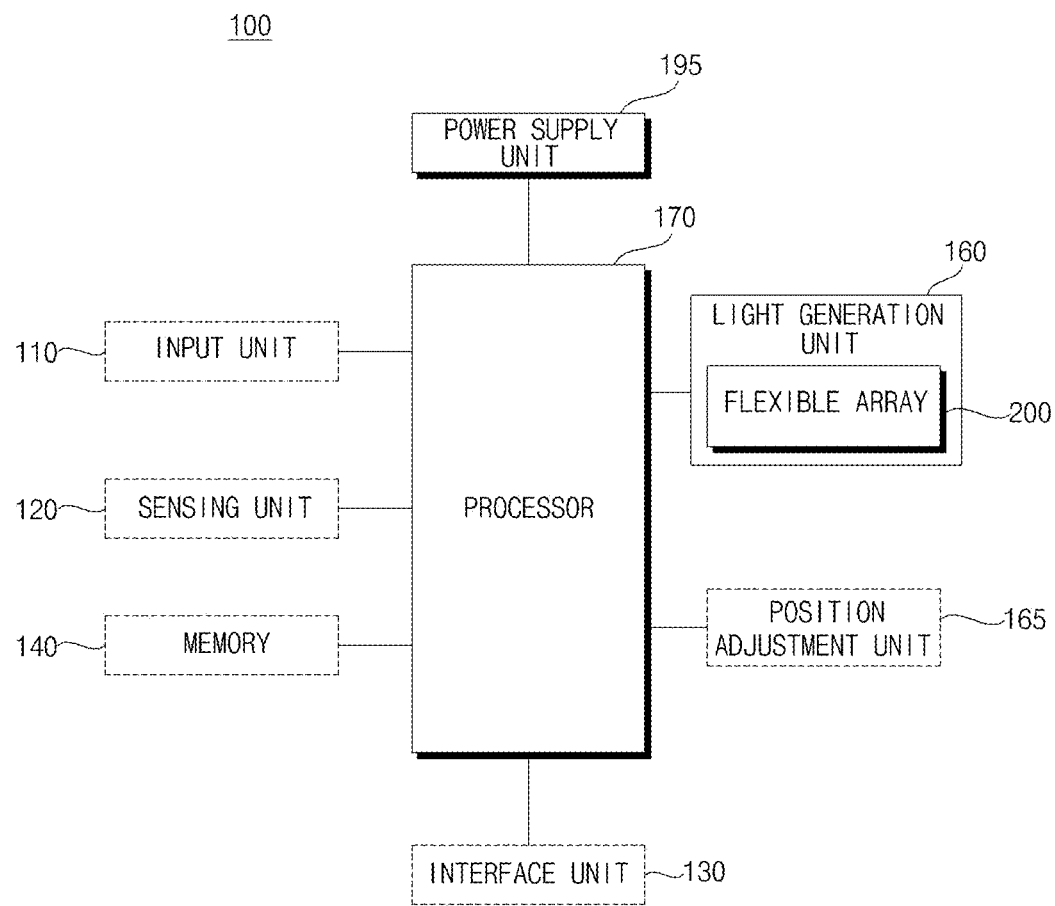
FIG. 2 is a block diagram of an example lamp for a vehicle.

FIG. 2 is a block diagram illustrating an example lamp for a vehicle.

Referring to FIG. 2, the lamp 100 may include a light generation unit 160, a processor 170, and a power supply unit 190.

The lamp 100 may further include an input unit 110, a sensing unit 120, an interface unit 130, a memory 140, and a position adjustment unit 165 individually or in combination.

The input unit 110 may receive a user input for controlling the lamp 100.

The input unit 110 may include one or more input devices. For example, the input unit 110 may include one or more of a touch input device, a mechanical input device, a gesture input device, and a voice input device.

The input unit 110 may receive a user input for controlling operation of the light generation unit 160.

For example, the input unit 110 may receive a user input for controlling turning on or off of the light generation unit 160.

The sensing unit 120 may include one or more sensors.

For example, the sensing unit 120 may include a temperature sensor or an illumination sensor.

The sensing unit 120 may acquire temperature information of the light generation unit 160.

The sensing unit 120 may acquire external illumination information of the vehicle 10.

The interface unit 130 may exchange information, data, or a signal with another device provided in the vehicle 10.

The interface unit 130 may transmit information, data, or a signal, received from another device provided in the vehicle 10, to the processor 170.

The interface unit 130 may transmit information, data, or a signal, generated by the processor 170, to another device provided in the vehicle 10.

The interface unit 130 may receive driving situation information.

The driving situation information may include at least one of: information on an object located outside of the vehicle 10, navigation information, and vehicle state information.

The information on an object located outside of the vehicle 10 may include: information on the presence of the object, information on a location of the object, information on movement of the object, information on a distance between the vehicle 10 and the object, information on a speed of the vehicle 10 relative to the object, and information on a type of the object.

The object information may be generated by an object detection apparatus provided in the vehicle 10. The object detection apparatus may detect an object based on sensing data generated by one or more sensors of: a camera, a radar, a LIDAR, an ultrasonic sensor, and an infrared sensor.

The object may include a line, a nearby vehicle, a pedestrian, a two-wheeled vehicle, a traffic signal, a light, a road, a structure, a bump, a geographical feature, and an animal.

The navigation information may include at least one selected from among map information, information on a set destination, information on a route to the set destination, and information on various object located along the route, lane information, and information on the current location of the vehicle 10.

The navigation information may be generated by a navigation apparatus provided in the vehicle 10.

The vehicle state information may include vehicle position information, vehicle speed information, vehicle tilt information, vehicle weight information, vehicle direction information, vehicle battery information, vehicle fuel information, vehicle tire pressure information, vehicle steering information, in-vehicle temperature information, in-vehicle humidity information, pedal position information, vehicle engine temperature information, etc.

The vehicle state information may be generated based on sensing information of various sensors provided in the vehicle 10.

The memory 140 may store basic data for each unit of the lamp 100, control data for the operational control of each unit of the lamp 100, and input/output data of the lamp 100.

The memory 140 may be any of various hardware storage devices, such as a ROM, a RAM, an EPROM, a flash drive, and a hard drive.

The memory 140 may store various data for the overall operation of the lamp 100, such as programs for the processing or control of the processor 170.

The memory 140 may be a subordinate element of the processor 170.

Under the control of the processor 170, the light generation unit 160 may convert electrical energy into light energy.

The light generation unit 160 may include a flexible array 200 where a plurality of groups of micro Light Emitting Diode (LED) chips is disposed.

A plurality of groups of micro LED chips may have different shapes.

In some implementations, there may be a plurality of flexible arrays. The plurality of flexible arrays may form an array module 200*m*.

In some implementations, the array module 200*m* may be configured such that a plurality of flexible arrays is stacked with one another.

A micro LED chip may be referred to as a micro LED light emitting device package.

A micro LED chip may include a light emitting device therein.

A micro LED is an LED chip of a few micro-meter. For example, the size of a micro LED may be 5 to 15 um.

A micro LED may be transferred onto a substrate.

The flexible array 200 may include a substrate and a subarray in which the plurality of micro LED chips is disposed. The flexible array 200 may include one or more subarrays.

The subarray may be in any of various shapes.

For example, the subarray may be in a shape of a figure-having a predetermined area.

For example, the subarray may have a circular shape, a polygonal shape, or a fan shape.

In some examples, the substrate may include a Flexible Copper Clad Laminated (FCCL) substrate.

A base 911 and a second anode 912*b* (see FIG. 8) may form a substrate.

The position adjustment unit 165 may adjust a position of the light generation unit.

The position adjustment unit 165 may control the light generation unit 160 to be tilted. Due to the tilting control of the light generation unit 160, output light may be adjusted in an up-down direction (e.g., the overall height direction).

The position adjustment unit 165 may control the light generation unit 160 to be panned. Due to the panning control of the light generation unit 160, output light may be adjusted in a left-right direction (e.g., the overall width direction).

The position adjustment unit 165 may further include a driving force generation unit (e.g., a motor, an actuator, and a solenoid) that provides a driving force required to adjust a position of the light generation unit 160.

When the light generation unit 160 generates a low beam, the position adjustment unit 165 may adjust a position of the light generation unit 160 downward further than when the light generation unit 160 generates a high beam.

When the light generation unit 160 generates a high beam, the position adjustment unit 165 may adjust a position of the light generation unit 160 upward further than when the light generation unit 160 generates a low beam.

The processor 170 may be electrically connected to each unit of the lamp 100. The processor 170 may control overall operation of each unit of the lamp 100.

The processor 170 may control the light generation unit 160.

By adjusting an amount of electrical energy supplied to the light generation unit 160, the processor 170 may control the light generation unit 160.

The processor 170 may control the flexible array 200 on a region basis.

For example, the processor 170 may control the flexible array 200 on a region basis in a manner of supplying a different amount of electrical energy to micro LED chips disposed on each region of the flexible array 200.

The processor 170 may control the array module 200*m* on a layer basis.

The plurality of layers in the array module 200*m* may be composed of a plurality of flexible arrays 200.

For example, the processor 170 may control the array module 200*m* on a layer basis in a manner of supplying a different amount of electrical energy to micro LED chips arranged in each layer of the array module 200*m*.

Under the control of the processor 170, the power supply unit 190 may supply electrical energy to each unit of the lamp 100. For example, the power supply unit 190 may be supplied with power from a battery inside the vehicle 10.

Figure 3:
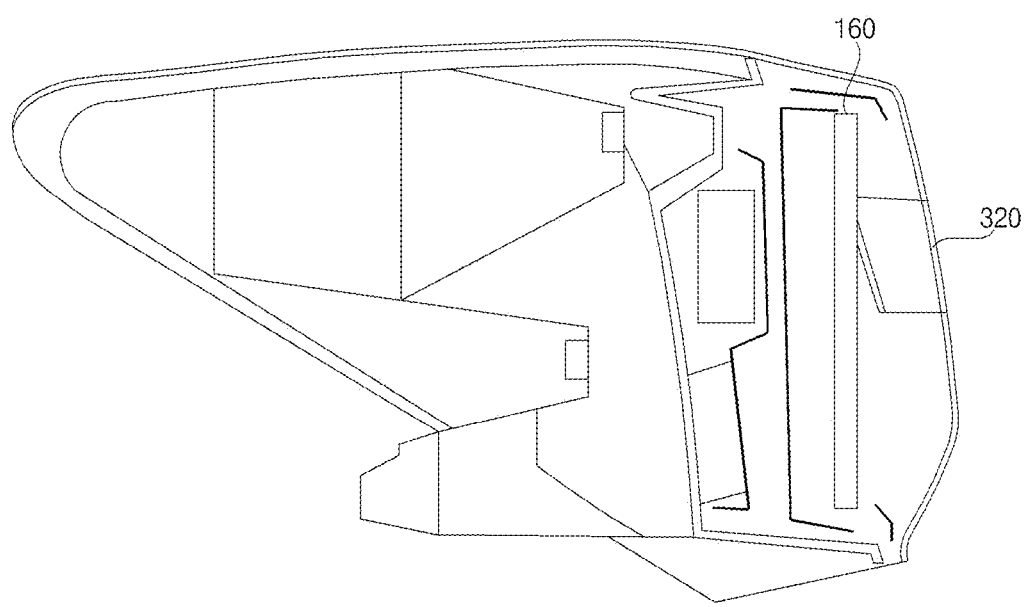
FIG. 3 is a cross-sectional view of an example lamp for a vehicle.

FIG. 3 is a diagram illustrating a lamp for a vehicle.

FIG. 3 illustrates an exemplary cross-section of a rear combination ramp 100*b* as an example of the lamp 100.

Referring to FIG. 3, a lamp 100 for a vehicle may include a light generation unit 160, and a first lens 320.

The first lens 320 may cover the light generation unit 160. The first lens 320 may allow light, generated by the light generation unit 160, to be refracted and pass therethrough. The first lens 320 may be an aspheric lens.

The first lens 320 may change an optical path of light generated by the light generation unit 160.

The first lens 320 may be formed of a transparent resin or a glass.

Figure 4:
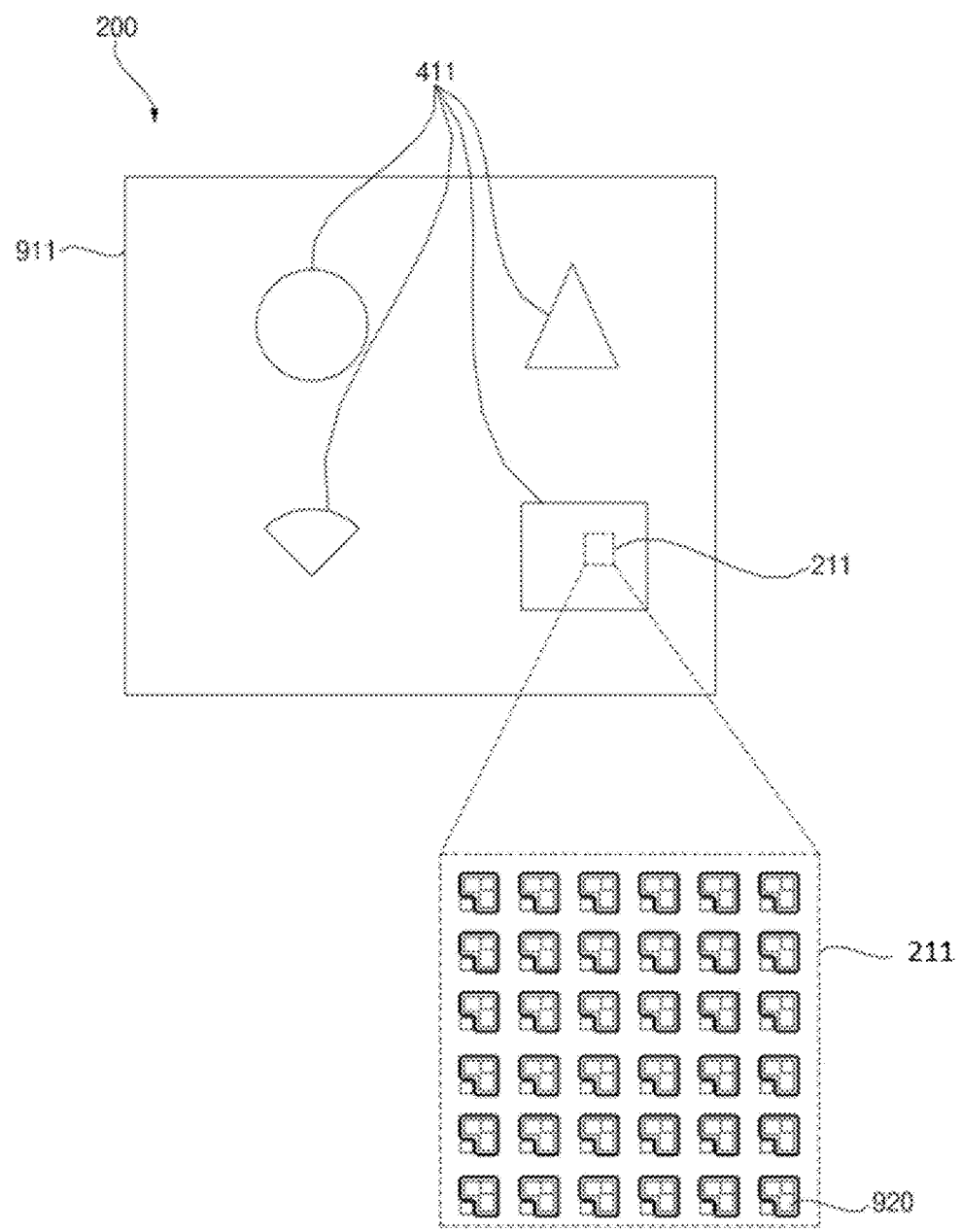
FIG. 4 is a diagram illustrating an example array module in which a plurality of micro Light Emitting Diode (LED) chips is disposed.

FIG. 4 is a diagram illustrating an example array module where a plurality of micro LED chips is arranged.

Referring to FIG. 4, a plurality of micro LED chips 920 may be disposed on the flexible array 200.

The plurality of micro LED chips 920 may be transferred onto the flexible array 200.

An interval for micro LED chips 920 on the flexible array 200, and a density of micro LED chips 920 (that is, the number of micro LED chips per unit area) on the flexible array 200 may be determined depending on a transfer interval.

The flexible array 200 may include a plurality of sub-arrays 411 in which a plurality of groups micro LED chips is disposed, respectively.

The flexible array 200 may include a base 911 and one or more sub-arrays 411. The flexible array may include areas 211.

The base 911 may be formed of a polyimide (PI) material or the like.

In some implementations, the base 911 may be a substrate. For example, the base 911 may be a Flexible Copper Clad Laminated (FCCL) which will be described later.

The sub-arrays 411 may be disposed on the base 911.

A plurality of micro LED chips 920 may be disposed in the sub-arrays 411.

The sub-arrays 411 may be generated by cutting a main array which is an FCCL where the plurality of micro LED chips 920 is disposed.

In this case, a shape of each sub-array 411 may be determined by a shape into which the main array is cut.

For example, the sub-array 411 may have a shape of a two-dimensional figure (e.g., a circular, polygonal, or fan shape).

Figure 5:
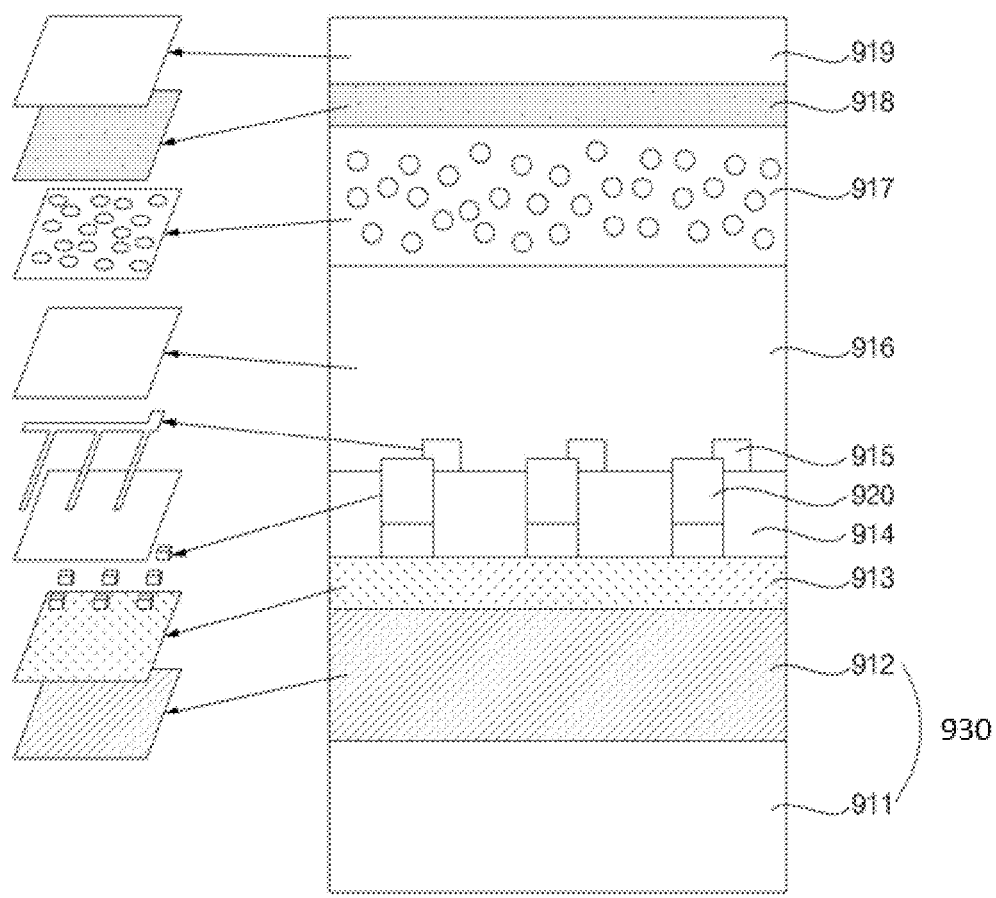
FIG. 5 is a diagram illustrating an example array module in which a micro LED chips is disposed.

FIG. 5 is a diagram illustrating an example flexible array where micro LED chips are disposed.

Referring to FIG. 5, the flexible array 200 may include a Flexible Copper Clad Laminated (FCCL) 930, a reflective layer 913, an inter-layer dielectric film 914, a plurality of micro LED chips 920, a second electrode 915, an optical spacer 916, a phosphor layer 917, a color filter film 918, and a cover film 919.

The FCCL 930 may include a polyimide (PI) film 911, and a first electrode 912.

The polyimide film 911 may be referred to as a base.

The first electrode 912 and the second electrode 915 may be formed of copper (Cu), and may be electrically connected to the plurality of micro LED chips 920 so as to provide power thereto.

The first electrode 912 and the second electrode 915 may be light transmissive electrodes.

The first electrode 912 may be an anode.

The second electrode 915 may be a cathode.

The first electrode 912 and the second electrode 915 may include at least one metal material or a combination of metal materials, including but not limited to nickel (Ni), platinum (Pt), ruthenium (Ru), iridium (Ir), rhodium (Rh), tantalum (Ta), molybdenum (Mo), titan (Ti), silver (Ag), tungsten (W), copper (Cu), chromium (Cr), palladium (Pd), vanadium (V), cobalt (Co), niobium (Nb), zirconium (Zr), indium tin oxide (ITO), aluminum zinc oxide (AZO) and Indium Zinc Oxide (IZO).

The first electrode 912 may be formed between the polyimide film 911 and the reflective layer 913.

The second electrode 915 may be formed on the inter-layer dielectric film 914.

The reflective layer 913 may be formed on the FCCL 930. The reflective layer 913 may reflect light generated by the plurality of micro LED chips 920. The reflective layer 913 may be formed of silver Ag, for instance.

The inter-layer dielectric film 914 may be formed on the reflective layer 913.

The plurality of micro LED chips 920 may be formed on the FCCL 930. The plurality of micro LED chips 920 may be attached to the reflective layer 913 or the FCCL 930 using a solder material or an Anisotropic Conductive Film (ACF).

For example, each of micro LED chips 920 may be an LED chip having a size of 10 to 100 μm.

The optical spacer 916 may be formed on the inter-layer dielectric film 914. The optical spacer 916 is used to keep the plurality of micro LED chips 920 and the phosphor layer 917, and may be formed of an insulating material.

The phosphor layer 917 may be formed on the optical spacer 916. The phosphor layer 917 may be formed of resin in which phosphorus is evenly distributed. Depending on a wavelength of light emitted from a micro LED chips 920, any one selected from a blue light-emitting phosphor, a blue-green light-emitting phosphor, a green light-emitting phosphor, a yellow-green light-emitting phosphor, a yellow light-emitting phosphor, a yellow-red light-emitting phosphor, an orange light-emitting phosphor, and a red light-emitting phosphor may be applied as the phosphor.

That is, a phosphor may be excited by light of a first color, which is emitted from the micro LED chips 920, to thereby generate a second color.

The color filter film 918 may be formed on the phosphor layer 917. The color filter film 918 may realize a specific color for light which has passed the phosphor layer 917. The color filter film 918 may realize at least one or a combination of red (R), green (G), and blue (B).

The cover film 919 may be formed on the color filter film 918. The cover film 919 may protect the flexible array 200.

Figure 6:
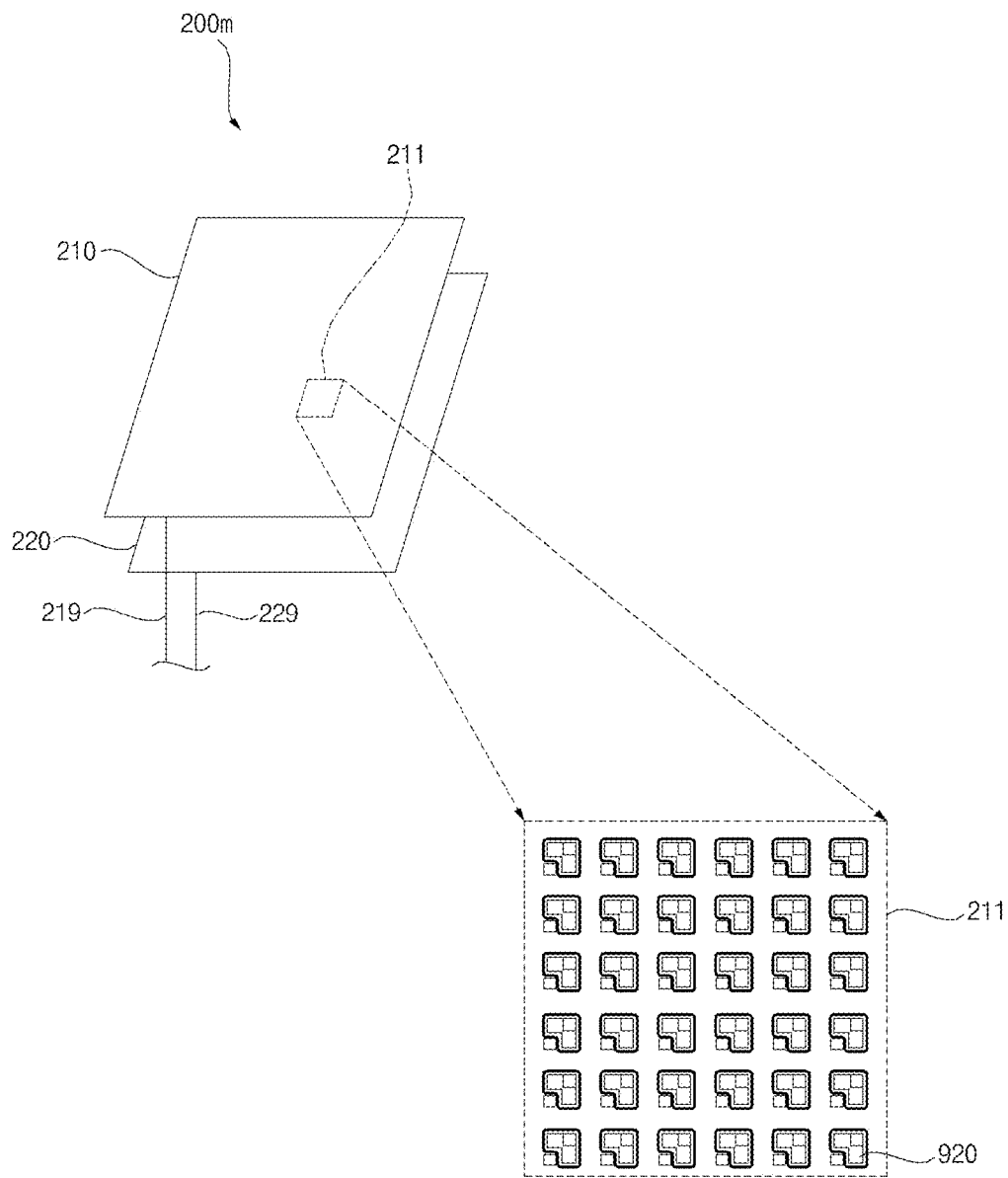
FIG. 6 is a diagram illustrating an example plurality of array modules.

FIG. 6 is a diagram illustrating an example array module.

Referring to FIG. 6, the light generation unit 160 may include an array module 200m which includes a plurality of flexible arrays.

For example, the light generation unit 160 may include a first flexible array 210 and a second flexible array 220.

The first flexible array 210 may be different from the second flexible array 220 in terms of at least one of: an interval for a plurality of micro LED chips, positions of the plurality of micro LED chips, and a density of the plurality of micro LED chips.

The second flexible array 220 may be different from the first flexible array 210 in terms of at least one of: an interval for a plurality of micro LED chips, positions of the plurality of micro LED chips, and a density of the plurality of micro LED chips.

The density of the plurality of micro LED chips indicates the number of micro LED chips per unit area.

In the first flexible array 210, a first group of micro LED chips may be disposed in a first pattern.

The first pattern may be determined by at least one of: an interval for micro LED chips included in the first group, positions of the micro LED chips included in the first group on an array module, and a density of the micro LED chips included in the first group.

A plurality of micro LED chips included in the first flexible array 210 may be disposed at a first interval.

The plurality of micro LED chips included in the first group may be disposed at the first interval.

In the second flexible array 220, a second group of micro LED chips may be disposed in a second pattern which is different from the first pattern.

The second pattern may be determined by at least one of: an interval for the micro LED chips included in the second group, positions of the micro LED chips included in the second group, and a density of the micro LED chips included in the second group.

The plurality of micro LED chips included in the second flexible array 220 may be disposed at an interval as the same as the interval at which the plurality of micro LED chips included in the first flexible array 210 is disposed.

The plurality of micro LED chips included in the second group may be disposed at an interval as the same as the interval at which the plurality of micro LED chips included in the first group is disposed.

That is, the plurality of micro LED chips included in the second group may be disposed at the first interval.

The plurality of micro LED chips included in the second group may be disposed not to overlap the plurality of micro LED chips included in the first group in a vertical or horizontal direction.

For example, the first group of micro LED chips may be disposed in the first flexible array 210 not to overlap the second group of micro LED chips when viewed from above while the first flexible array 210 and the second flexible array 220 overlap each other.

For example, the second group of micro LED chips may be disposed in the second flexible array 220 not to overlap the first group of micro LED chips when viewed from above while the second flexible array 220 and the first flexible array 210 are stacked. For example, projection lines of the second group of micro LED devices may be offset from projection lines of the first ground of micro LED devices when the first and second flexible arrays 210 and 220 are stacked.

Due to such arrangement, it is possible to minimize intervention of the first group of micro LED chips in output power from the second group of micro LED chips.

In some implementations, the light generation unit 160 may include three or more flexible arrays.

Figure 7A:
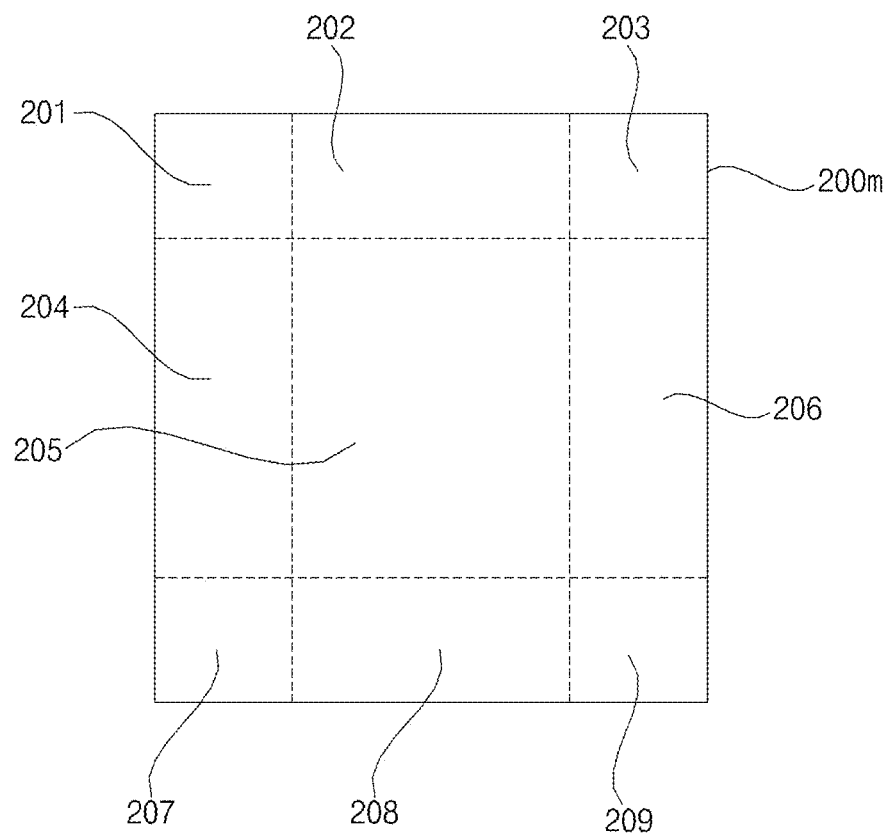
FIG. 7A illustrates an exemplary top view of a plurality of array modules overlapping each other.

FIG. 7A illustrates an exemplary top view of a plurality of array modules overlapping each other.

Figure 7B:
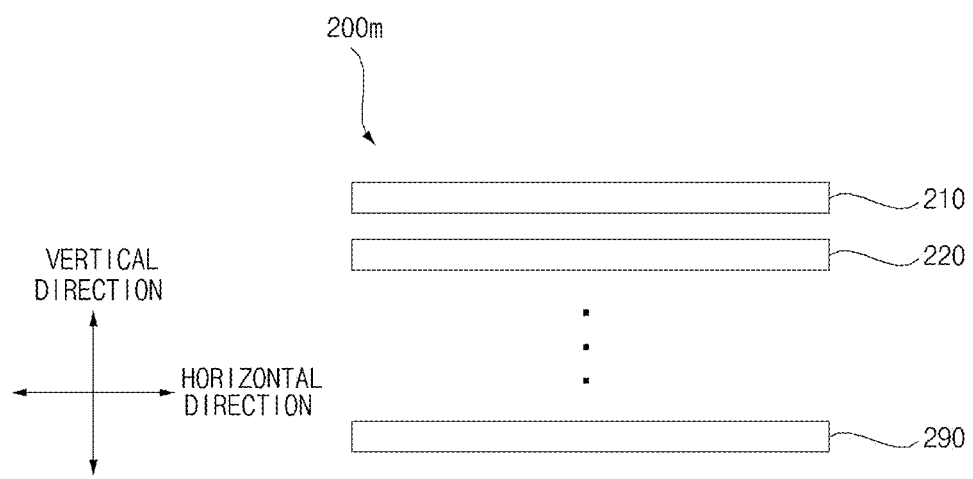
FIG. 7B illustrates an exemplary side view of the plurality of array modules overlapping each other.

FIG. 7B illustrates an exemplary side view of the plurality of array modules overlapping each other.

Referring to FIGS. 7A and 7B, the processor 170 may control an array module 200m on a region (e.g., any of region 201 to 209) basis. The regions 201 to 209 shown in FIG. 7A may be defined in each layer 210 to 290 shown in FIG. 7B of the plurality of array modules 200m.

The processor 170 may adjust a light distribution pattern by controlling the array module 200m on a region basis.

The array module 200m may be divided into a plurality of regions 201 to 209.

The processor 270 may adjust an amount of electrical energy to be supplied to each of the plurality of regions 201 to 209.

The processor 170 may control the array module 200m on a layer basis.

The processor 270 may adjust an amount of light of output power by controlling the array module 200m on a layer basis.

The array module 200m may be composed of a plurality of layers. The plurality of layers may be composed of a plurality of flexible arrays, respectively.

For example, a first layer of the array module 200m may be formed by a first flexible array, and a second layer of the array module 200m may be formed by a second flexible array.

The processor 270 may adjust an amount of electrical energy to be supplied to each of the plurality of layers.

Figure 8:
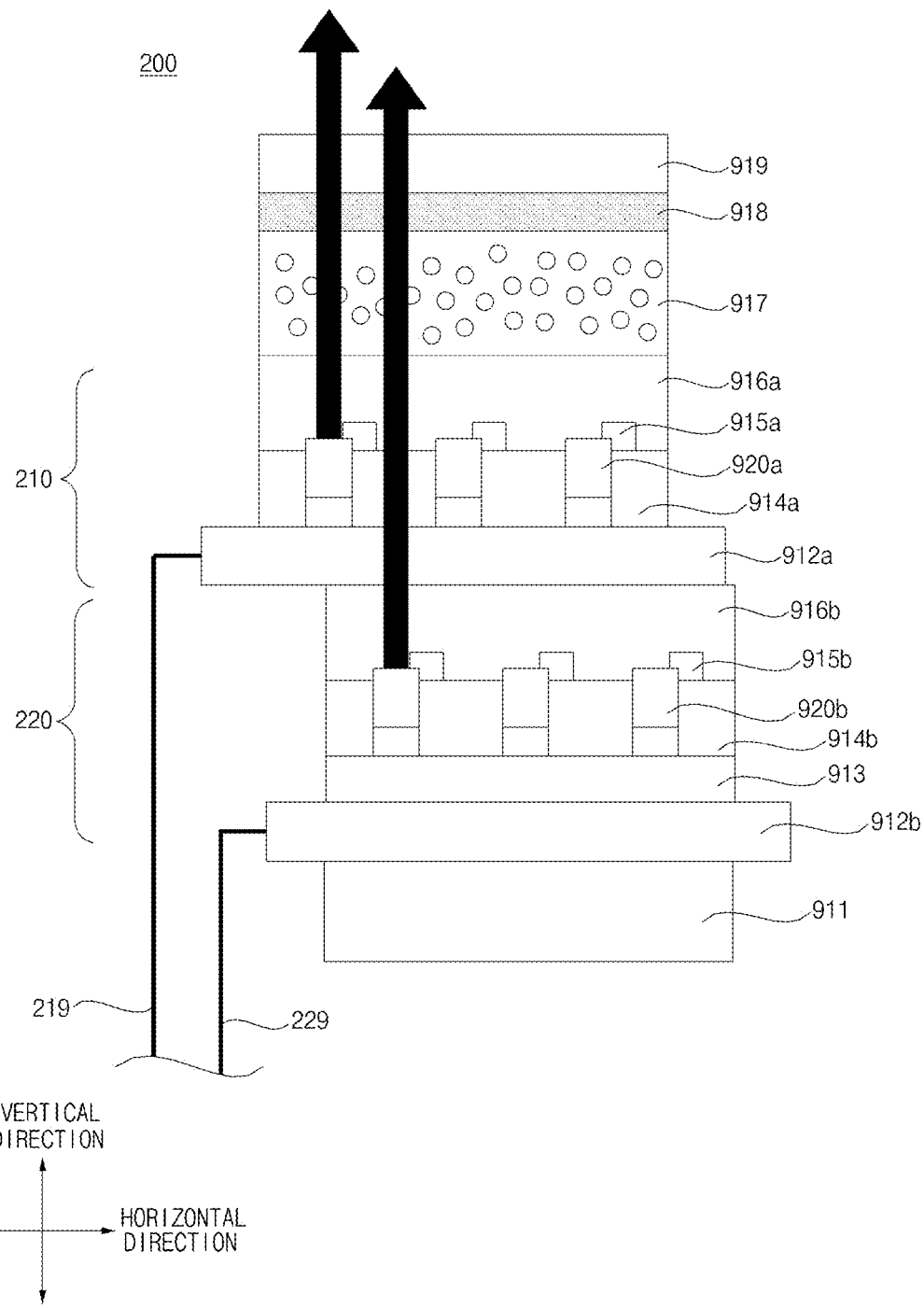
FIG. 8 is a diagram illustrating an example array module.

FIG. 8 is a diagram an example array module.

FIG. 8 illustrates a first flexible array 210 and a second flexible array 220 included in the array module 200m.

However, the array module 200m may include three or more flexible arrays.

Referring to FIG. 8, the array module 200m may include a base 911, the first flexible array 210, and the second flexible array 220.

In some implementations, the array module 200m may further include a phosphor layer 917, a color filter film 918, and a cover film 919 in combination or individually. In some examples, the array modules 200m may include a single phosphor layer 917 that receives light from the array modules 200m that are stacked.

The base 911 may be formed of polyimide (PI). In some examples, the base 911 may be a flexible printed circuit board (PCB).

The second flexible array 220 may be disposed on the base 911.

The second flexible array 220 may be disposed between the first flexible array 210 and the base 911.

The second flexible array 220 may include a second anode 912b, a reflective layer 913, a second inter-layer dielectric film 914b, a second group of micro LED chips 920b, a second optical spacer 916b, and a second cathode 915b.

The second anode 9112 and the second cathode 915b may be light transmissive electrodes.

The second anode 912b and the second cathode 915b may be referred to as transparent electrodes.

The second flexible array 220 may include a transparent electrode.

The second anode 912b and the second cathode 915b may include at least one metal material or a combination of metal materials, including but not limited to nickel (Ni), platinum (Pt), ruthenium (Ru), iridium (Ir), rhodium (Rh), tantalum (Ta), molybdenum (Mo), titan (Ti), silver (Ag), tungsten (W), copper (Cu), chromium (Cr), palladium (Pd), vanadium (V), cobalt (Co), niobium (Nb), zirconium (Zr), indium tin oxide (ITO), aluminum zinc oxide (AZO) and Indium Zinc Oxide (IZO).

The second anode 912b may be formed between the base 911 and the reflective layer 913.

The second cathode 915b may be formed on the second inter-layer dielectric film 914b.

The reflective layer 913 may be formed on the second anode 912b. The reflective layer 913 may reflect light generated by a plurality of micro LED chips 920. The reflective layer 913 may be made of silver (Ag), for instance.

The second inter-layer dielectric film 914b may be formed on the reflective layer 913.

The second group of micro LED chips 920b may be formed on the second anode 912b. Each of the micro LED chips 920b included in the second group may be attached to the reflective layer 913 or the second anode 912b using a solder material or an Anisotropic Conductive Film (ACF).

The second optical spacer 916b may be formed on the second inter-layer dielectric film 914b. The second optical spacer 916b is used to keep the second group of micro LED chips 920b and the first flexible array 210 at a distance from each other, and the second optical spacer 916b may be made of an insulating material.

The first flexible array 210 may be formed on the second flexible array 220.

The first flexible array 210 may include a first anode 912a, a first inter-layer dielectric film 914a, a first group of micro LED chips 920a, a first optical spacer 916a, and a first cathode 915a.

The first anode 912a and the first cathode 915a may be light-transmissive electrodes.

The first anode 912a and the first cathode 915a may be referred to as transparent electrodes.

The first flexible array 210 may include a transparent electrode.

The first anode 912a and the first cathode 915a may include at least one metal material or a combination of metal materials, including but not limited to nickel (Ni), platinum (Pt), ruthenium (Ru), iridium (Ir), rhodium (Rh), tantalum (Ta), molybdenum (Mo), titan (Ti), silver (Ag), tungsten (W), copper (Cu), chromium (Cr), palladium (Pd), vanadium (V), cobalt (Co), niobium (Nb), zirconium (Zr), indium tin oxide (ITO), aluminum zinc oxide (AZO) and Indium Zinc Oxide (IZO).

The first anode 912a may be formed between the second optical spacer 916b and the first inter-layer dielectric film 914a.

The first cathode 915a may be formed on the first inter-layer dielectric film 914a.

The first inter-layer dielectric film 914a may be formed on the first anode 912a.

The first group of micro LED chips 920a may be formed on the first anode 912a. Each of the micro LED chips 920a included in the first group may be attached to the first anode 912a using a solder material or an Anisotropic Conductive Film (ACF).

The first optical spacer 916a may be formed on the first inter-layer dielectric film 914a. The first optical spacer 916a is used to keep the first group of micro LED chips 920a and the phosphor layer 917 at a distance from each other, and the first optical spacer 916a may be made of an insulating material.

The phosphor layer 910 may be formed on the first flexible array 210 and the second flexible array 220.

The phosphor layer 917 may be formed on the first optical spacer 916a. The phosphor layer 917 may be formed of resin in which a phosphorus is evenly distributed.

Depending on a wavelength of light emitted from the first and second groups of micro LED chips 920a and 920b, any one selected from a blue light-emitting phosphor, a blue-green light-emitting phosphor, a green light-emitting phosphor, a yellow-green light-emitting phosphor, a yellow light-emitting phosphor, a yellow-red light-emitting phosphor, an orange light-emitting phosphor, and a red light-emitting phosphor may be applied as the phosphor.

The phosphor layer 917 may change wavelengths of lights emitted from the micro LED chips 920a and 920b included in the first and second groups.

The phosphor layer 917 may change a wavelength of first light generated by the first group of micro LED chips 920a, and a wavelength of second light generated by the second group of micro LED chips 920b.

The first color filter film 918 may be formed on the phosphor layer 917. The color filter film 918 may realize a specific color for light which has passed through the phosphor layer 917. The color filter film 918 may realize any one of red (R), green (G), blue (B), or a combination thereof.

The cover film 919 may be formed on the color filter film 918. The cover film 919 may protect the array module 200m.

In some examples, the plurality of micro LED chips 920b included in the second flexible array 220 may be disposed not to overlap the plurality of micro LED chips 920a included in the first flexible array 210 in a vertical or horizontal direction.

The plurality of micro LED chips 920b included in the second group may be disposed not to overlap the plurality of micro LED chips 920a included in the first group in a vertical or horizontal direction.

The vertical direction may be a direction in which the array module 200m is stacked.

The first and second groups of micro LED chips 920a and 920b may output light in the vertical direction.

The horizontal direction may be a direction in which the first and second groups of micro LED chips 920a and 920b are disposed.

The horizontal direction may be a direction in which the base 911, the first and second anodes 912a and 912b, or the phosphor layer 917 extends.

In some implementations, the lamp 100 may further include a wire via which power is supplied to the array module 200m.

For example, the lamp 100 may include a first wire 219 and a second wire 229.

Via the first wire 219, power may be supplied to the first flexible array 210. The first wire 219 may consist of a pair of wires. The first wire 219 may be connected to the first anode 912a and/or the first cathode 915a.

Via the second wire 229, power may be supplied to the second flexible array 220. The second wire 229 may consist of a pair of wires. The second wire 229 may be connected to the second anode 912b and/or the second cathode 915b.

The first wire 219 and the second wire 229 may be disposed not to overlap each other.

Figure 9:
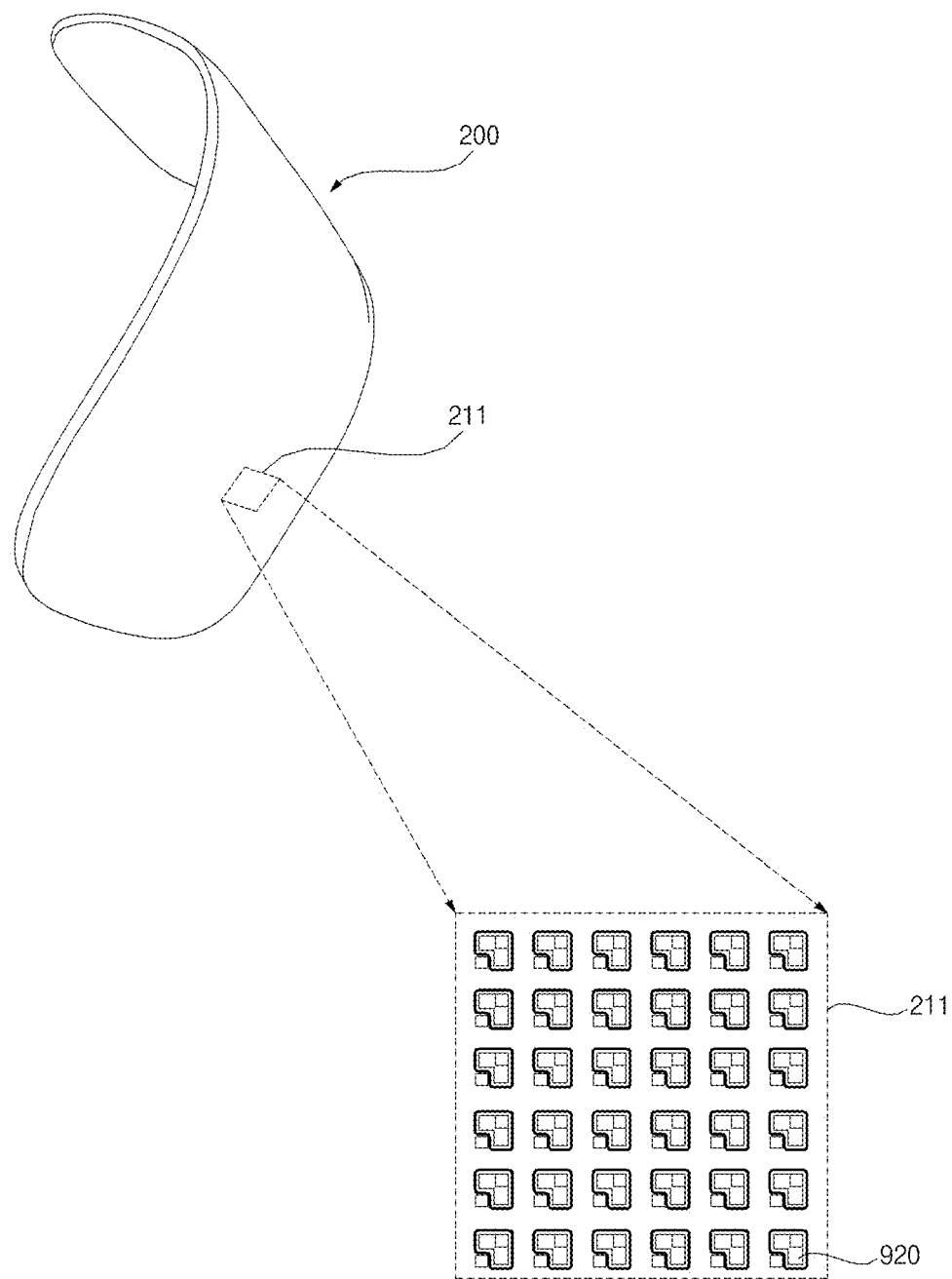
FIG. 9 is a diagram illustrating an example exterior appearance of an example flexible array.

FIG. 9 is a diagram illustrating an example exterior appearance of an example flexible array.

Figure 10A:
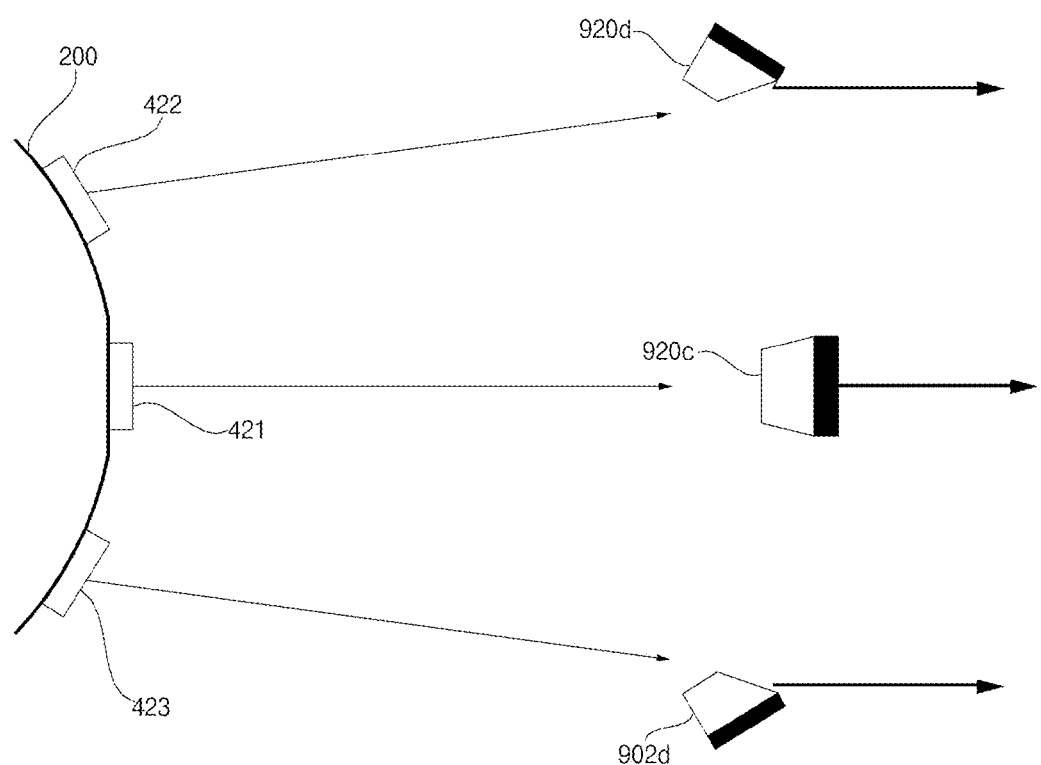
FIGS. 10A and 10B are schematic views of an example flexible array and example micro LED chips.
Figure 10A:
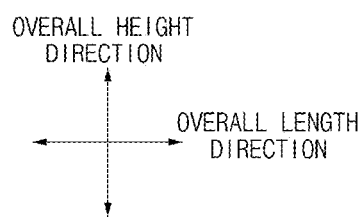
Figure 10B:
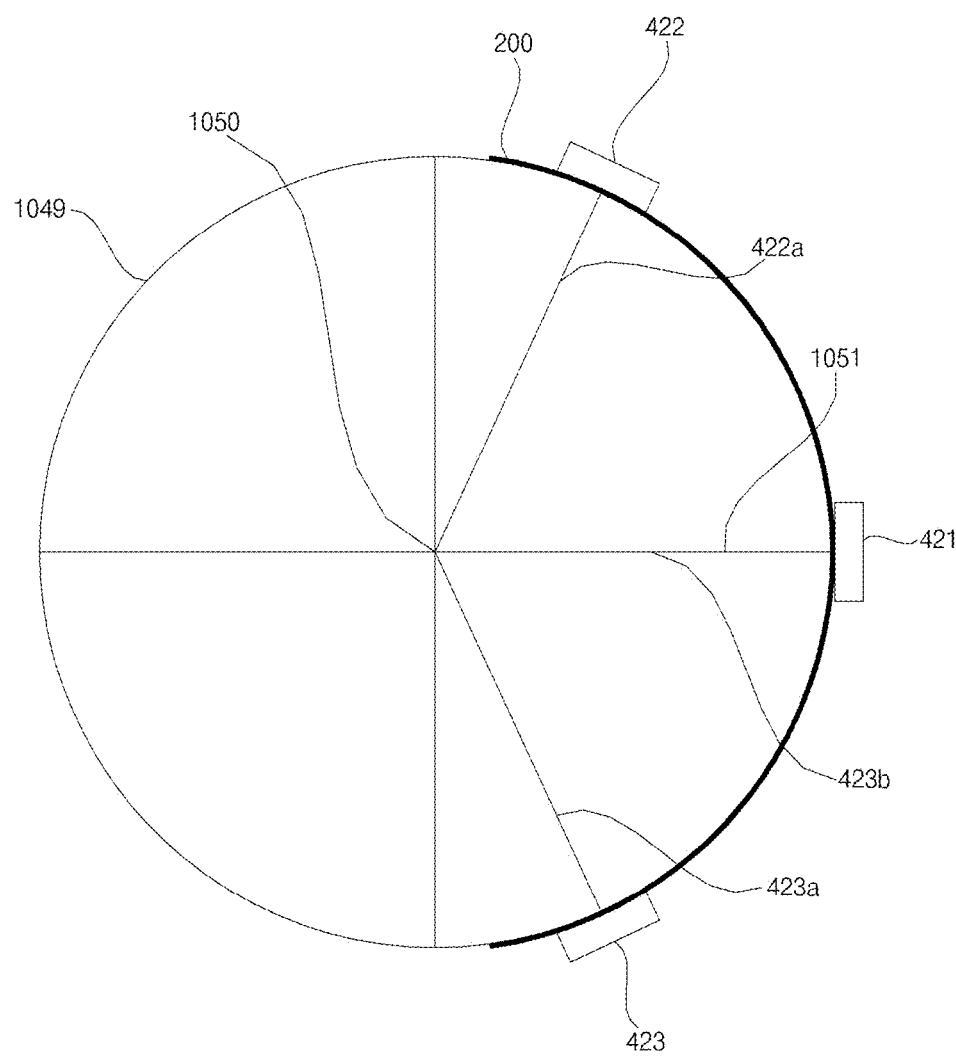

FIGS. 10A and 10B are schematic views of an example flexible array and example micro LED chips. FIG. 10 is an exemplary side view.

Referring to the drawings, a plurality of groups of micro LED chips 920c and 920d may be disposed in the flexible array 200.

The plurality of groups of micro LED chips 920c and 920d may have different shapes.

As illustrated in FIG. 10A, the flexible array 200 may be bent with a different curvature in each region.

The flexible array 200 may be divided into a plurality of regions 421, 422, and 423.

The flexible array 200 may be divided into the plurality of regions 421, 422, and 423 according to curvatures with which the plurality of regions 421, 422, and 423 is bent respectively.

The flexible array 200 may include a first region 421, a second region 422, and a third region 423.

The first region 421 may be a region which is bendable with a first curvature.

The second region 422 may be a region which is bendable with a second curvature. The second curvature may be greater than the first curvature.

The third region 423 may be a region which is bendable with a third curvature. The third curvature may be greater than the first curvature.

For example, a curvature may be defined as the inverse of the radius of the circle which contacts an inner surface of the flexible array 200 which is bent.

In addition, a curvature may be a degree of bending of the flexible array 200.

For example, when a curvature for one region of the flexible array 200 is 0, the region may be in a flat state where the region is flat.

Micro LED chips 920c, 920d, and 920d respectively disposed in the plurality of regions 421, 422, and 423 may have different shapes.

A micro LED chip 920c included in a first group and having a first shape may be disposed in the first region 421. The first micro LED chip 920c included in the first group and having the first shape will be described with reference to FIG. 11A.

A second micro LED chip 920d included in a second group and having a second shape may be disposed in the second region 422. The second micro LED chip 920d included in the second group and having the second shape will be described with reference to FIG. 11B.

A micro LED chip 902d included in a third group and having the second shape may be disposed in the third region 423. The micro LED chip 902d included in the third group and having the second shape will be described with reference to FIG. 11B. The micro LED chip included in the third group may be horizontally symmetric to the micro LED chip included in the second group.

As illustrated in FIG. 10B, the flexible array 200 may be bent with a constant curvature.

When viewed from the side, the flexible array 200 may be bent to contact a virtual circle 1049 in the overall height direction. In this case, the flexible array 200 may have an arc-shaped cross-section. In this case, the curvature of the flexible array 200 may be the inverse of the radius of the virtual circle 1049.

The flexible array 200 may be divided into a plurality of regions 421, 422, and 423.

The flexible array 200 may be divided into a plurality of regions 421, 422, and 423 according to positioned thereof on the flexible array 200.

The flexible array 200 may be divided based on angle ranges in a clockwise direction or in a counter clockwise direction between a virtual line, which connects a center 1050 of a virtual circle 1049 and the flexible array 200, and a line 1052, which passes through the center 1050 of the virtual circle 1049 and is parallel to the horizon.

In this case, the counter clockwise direction to the line 1051 passing through the virtual line 1048 and being parallel to the horizon is defined as "+", and the clockwise direction is defined as "−".

The flexible array 200 may include a first region 421, a second region 422, and a third region 423.

The first region 421 may be a region with a first angle range. The first angle range may be a range between +70° degrees and −70°.

The second region 422 may be a region with a second angle range. The second angle range may a range between +70° to +90°.

The third region 423 may be a region with a third angle range. The third angle range may be a range between −70 degrees and −90 degrees.

Micro LED chips 920c, 920d, and 920e respectively disposed in the plurality of regions 421, 422, and 423 may have different shapes.

A first micro LED chip 920c included in a first group and having a first shape may be arranged in the first region 421.

The first micro LED chip 920c included in the first group and having the first shape will be described with reference to FIG. 11A.

A second micro LED chip 920d included in a second group and having a second shape may be disposed in the second region 422. The second micro LED chip 920d included in the second group and having the second shape will be described with reference to FIG. 11B.

A micro LED chip 902d included in a third group and having the second shape may be disposed in the third region 423. The second micro LED chip 920d included in the third group and having the second shape will be described with reference to FIG. 11C. The micro LED chip included in the third group may be horizontally symmetric to the micro LED chip included in the second group.

In some examples, the plurality of groups of micro LED chips 920c, 920d, and 920e may output light in different directions.

For example, when the plurality of micro LED chips 920c, 920d, and 920e is placed in the same plane, the plurality of micro LED chips 920c, 920d, and 920e may output light in different directions, respectively.

Figure 11A:
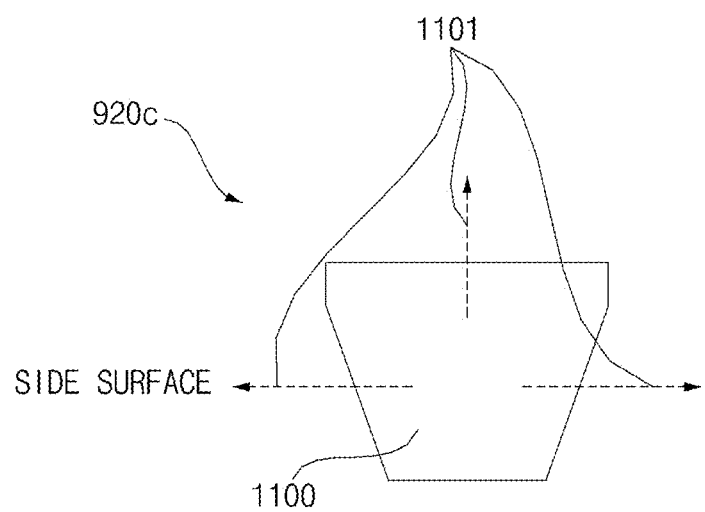
FIGS. 11A to 11C are diagrams illustrating example shapes of an example plurality of micro LED chips.
Figure 11A:
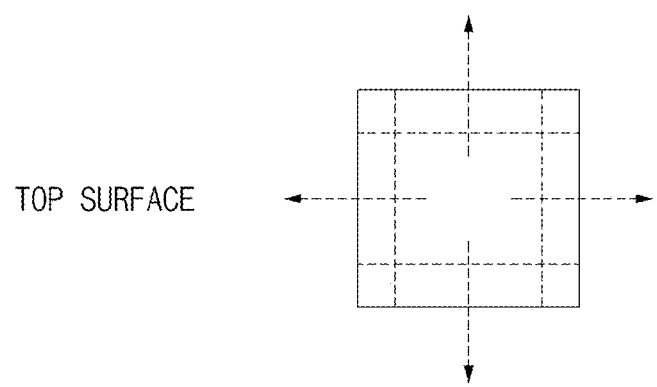
Figure 11B:
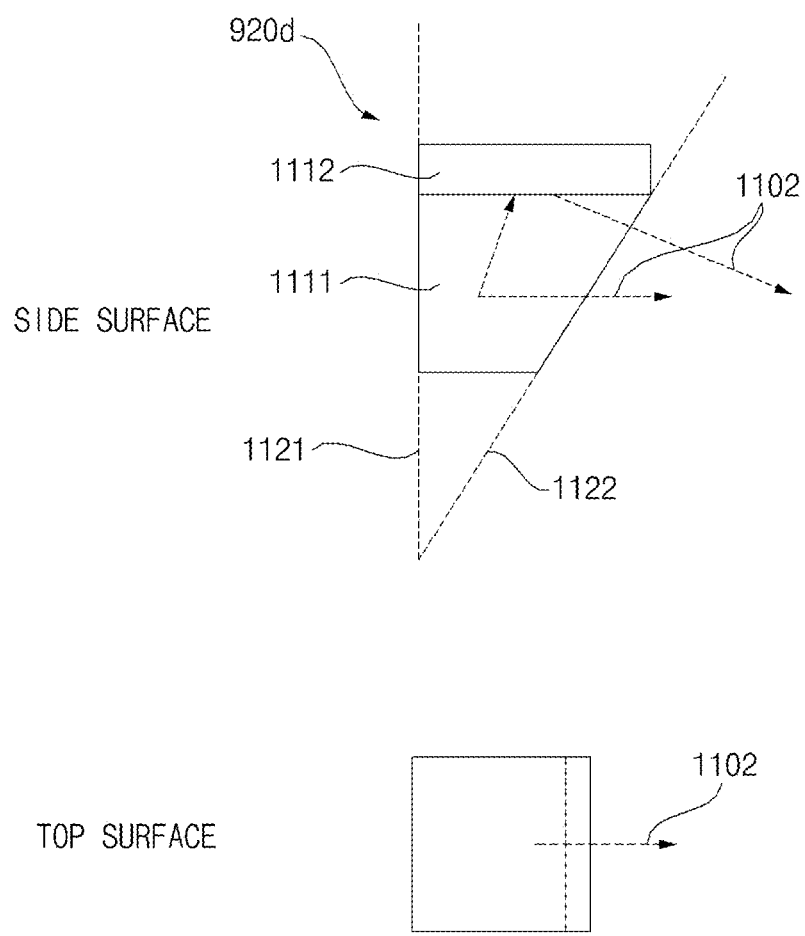
Figure 11C:
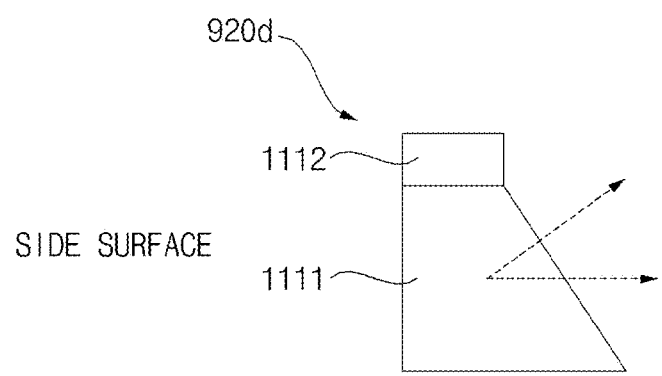
Figure 11C:
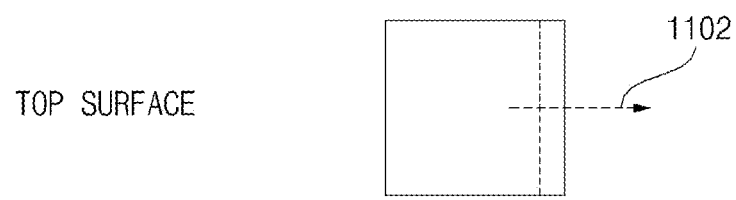

FIGS. 11A to 11C are diagrams illustrating example shapes of a plurality of micro LED chips.

FIG. 11A is a schematic view illustrating an example of a first micro LED chip 920c included in a first group and having a first shape, the first micro LED chip 920c which is shown in FIGS. 10A and 10B.

Referring to FIG. 11A, the first micro LED chip 920c included in the first group and having the first shape (hereinafter, referred to as a first micro LED chip) may have a normal shape.

The first micro LED chip 920c may include a body 1100.

The body 1100 may include a p-n diode layer. The p-n diode layer may include a first-type semiconductor layer (e.g., a p-doped layer), an active layer, and a second-type semiconductor layer (e.g., a n-doped layer).

When viewed from the side, the first micro LED chip 920c may have a trapezoidal shape having an upper edge longer than a lower edge. A vertical cross-section of the body 1100 may be vertically symmetric.

When viewed from above, the body 1100 of the first micro LED chip 920c may have a rectangular shape.

The first micro LED chip 920c may output light 1101 in an upward direction and in a lateral direction. The first micro LED chip 920c may output the light in the upward direction and in any direction.

FIG. 11B is a schematic view illustrating an example of a second micro LED chip 920d included in a second group and having a second shape, the micro Led chip 920d which is shown in FIGS. 10A and 10B.

Referring to FIG. 11B, the micro LED chip included in the second group and having the second shape (hereinafter, referred to as a second micro LED chip) may have a shape different from the shape of the first micro LED chip 920c.

The second micro LED chip 920d may include a body 1111 and a reflective layer 1112.

The body 1111 may include a p-n diode layer. The p-n diode layer may include a first-type semiconductor layer (e.g., a p-doped layer), an active layer, and a second-type conductor layer (e.g., a n-doped layer).

The body 1111 may have a horizontal cross-section which gradually becomes greater toward the reflective layer 1112.

A vertical cross-section of the body 1111 may be vertically asymmetric.

For example, a side surface 1122 of the body 1111 may form a tilting angle relative to a direction vertical to a reflective layer 1112. The side surface 1122 of the body 1111 may form an acute angle relative to the reflective layer 1112.

In some examples, the tilting angle formed by the side surface 1122 of the body 1111 in the direction 1121 vertical to the reflective layer 1112 may be determined based on a second curvature.

For example, the greater the second curvature, the greater the tilting angle.

For example, the smaller the second curvature, the smaller the tilting angle.

The reflective layer 1112 may be disposed on the body 1111.

The reflective layer 1112 may reflect light generated by the body 1111. It is desirable that the reflective layer 1112 is formed of silver (Ag).

When viewed from above, the body 1100 of the second micro LED chip 920d may have a rectangular shape.

The second micro LED chip 920d may focus and output light 1102 in one direction.

For example, when the lamp 100 functions as a rear combination lamp 100b, the second micro LED chip 920d may focus light 1102 in a direction rearward of the vehicle 10.

FIG. 11C is a schematic diagram illustrating another shape of the second micro LED chip 920d included in the second group and having the second shape according to FIGS. 10A and 10B.

The second micro LED chip 920d in FIG. 11C may have a shape different from the shape of the second micro LED chip shown in FIG. 11B.

The second micro LED chip 920d may include the body 111 and the reflective layer 1112.

The body 1111 may have a horizontal cross-section which becomes smaller toward the reflective layer 1112.

A vertical cross-section of the body 1111 may be vertically asymmetric.

The side surface 1122 of the body 1111 may be tilted relative to a direction 1121 vertical to the reflective layer 1112. The side surface 1122 of the body 1111 may form an obtuse angle relative to the reflective layer 1112.

Figure 12A:
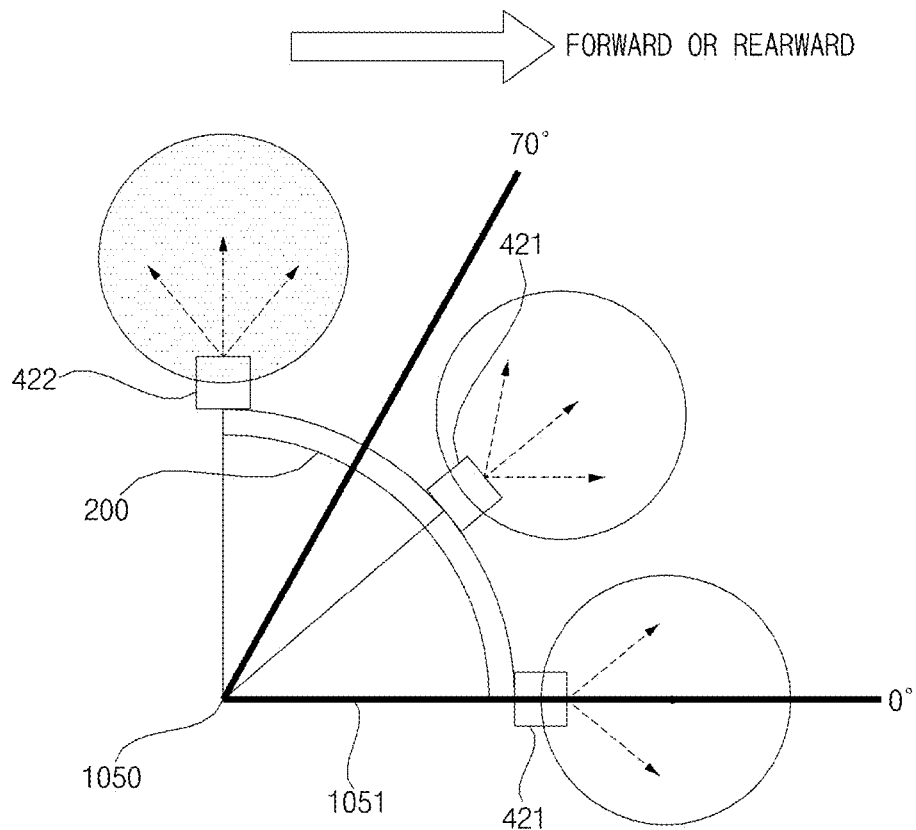
FIGS. 12A and 12B are diagrams illustrating an example plurality of groups of micro LED chips disposed in an example flexible array.
Figure 12A:
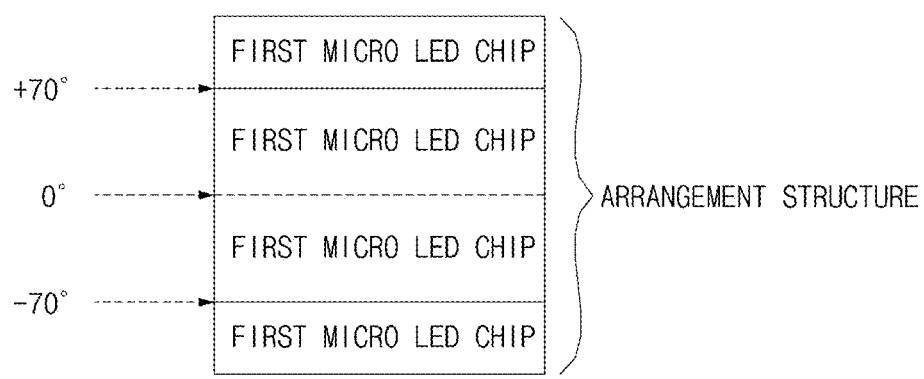
Figure 12B:
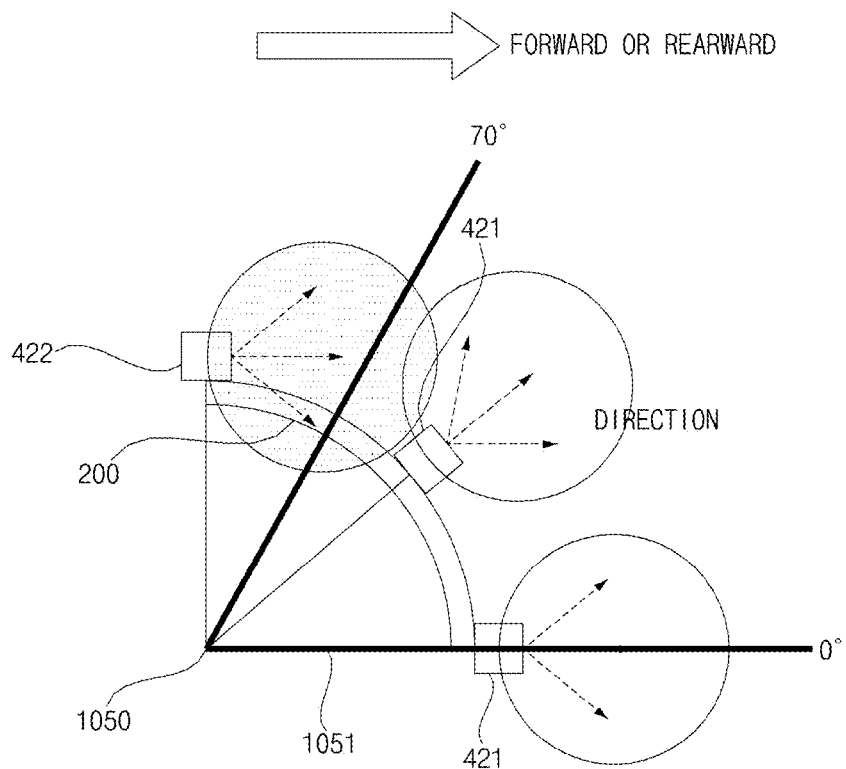
Figure 12B:
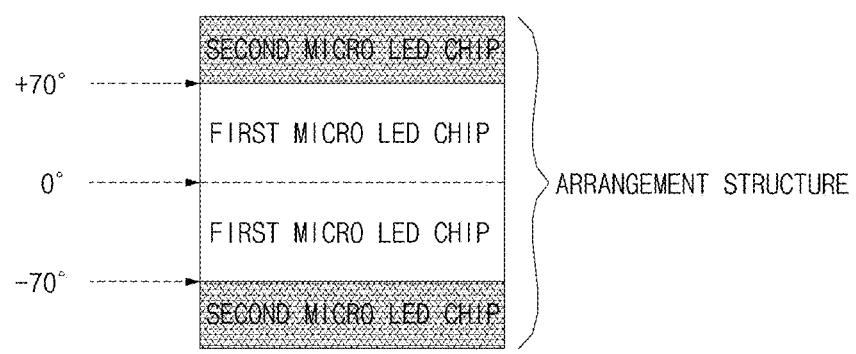

FIGS. 12A and 12B are diagrams illustrating an example plurality of groups micro LED chips disposed in a flexible array.

As described above with reference to FIG. 10B, the flexible array 200 may be bent with a constant curvature.

The flexible array 200 may include a plurality of regions 421, 422, and 426.

The plurality of regions 421 and 422 may be distinguished from each another based on where each of the plurality of regions 421 and 422 is positioned on the flexible array 200.

For example, when viewed from the side, the first region 421 may be a region ranging from +70° and −70° between a virtual line, which connects the center 1050 the virtual circle and the flexible array 200, and a line 1051, which passes through the center 1050 of the virtual circle and is parallel to the horizon.

For example, when viewed from side, the second region 422 may be a region ranging from −70° to −90° between the virtual line, which connects the center 1050 of the virtual circle and the flexible array 200, and the line 1051, which passes through the center 1050 of the virtual circle and is parallel to the horizon.

As illustrated in FIG. 12A, the first micro LED chip 920c may be disposed in each of the first region 421 and the second region 422.

As illustrated in FIG. 12B, the first micro LED chip 920c may be disposed in the first region 421, and the second micro LED chip 920d may be disposed in the second region 422.

If the lamp 100 is functioning as the rear combination lamp 100b, an area rearward of the vehicle 10 may need a high light intensity.

When the lamp 100 includes a flexible array 200 shown in FIG. 12A, a first micro LED chip 920c is disposed in a second region 422 to thereby allow light distributed upward and downward from the vehicle 10, thereby reducing light intensity in the area rearward of the vehicle 10.

When the lamp 100 includes a flexible array 200 shown in FIG. 12B, a second micro LED chip 920d is disposed in a second region 422 to thereby allow light focused in a direction rearward of the vehicle 10. In addition, uniformity of luminous intensity may improve and color deviation may decrease.

If the lamp 100 functions as the head lamp 100a or the fog lamp 10c, a forward area of the vehicle 10 may need a high light intensity.

When the lamp 100 includes the flexible array 200 shown in FIG. 12A, the first micro LED chip 920c is disposed in the second region 422 to thereby make light distributed upward or downward from the vehicle 10, thereby reducing light intensity in an area forward of the vehicle 10.

When the lamp 100 includes the flexible array 200 shown in FIG. 12B, the second micro LED chip 920d is disposed in the second region 422 to thereby make light focused in the area forward of the vehicle 10. In addition, uniformity of luminous intensity may increase and color deviation may decrease.

Figure 13A:
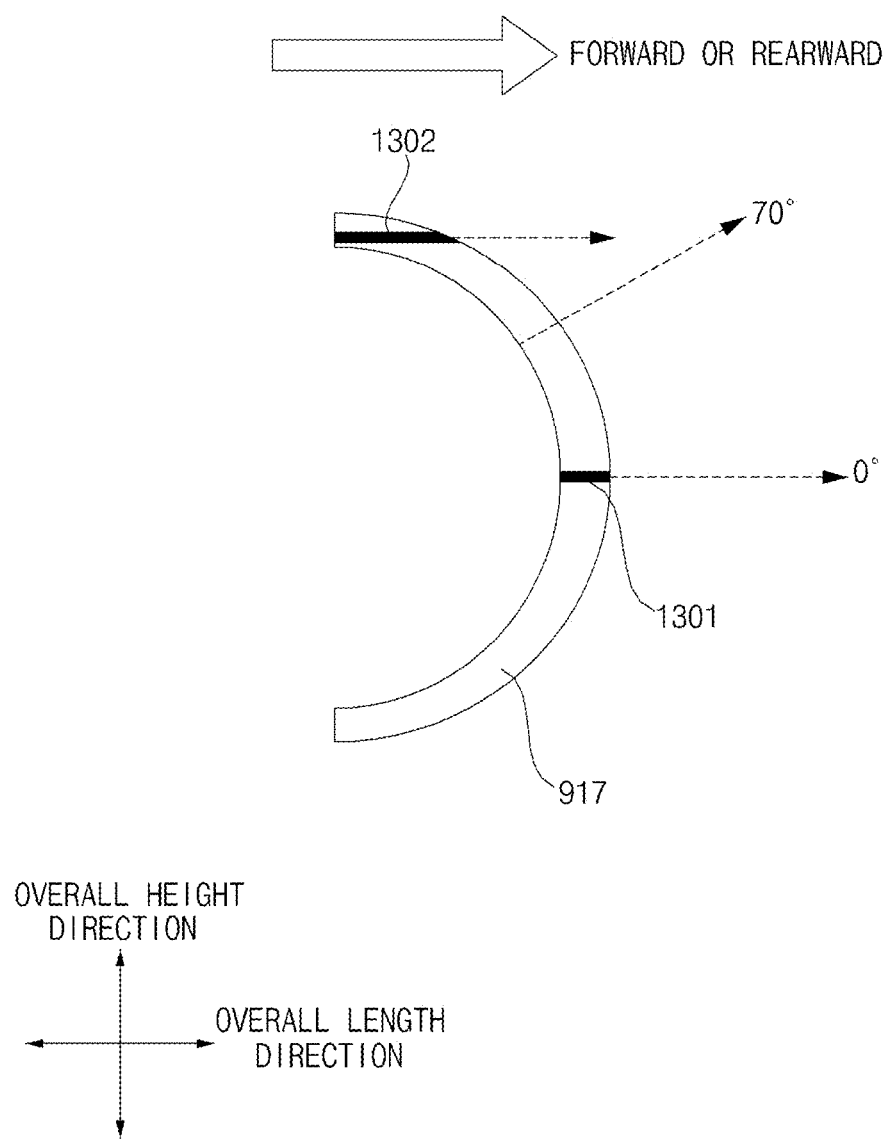
FIGS. 13A and 13B are diagrams illustrating an example phosphor layer of an example flexible array.
Figure 13B:
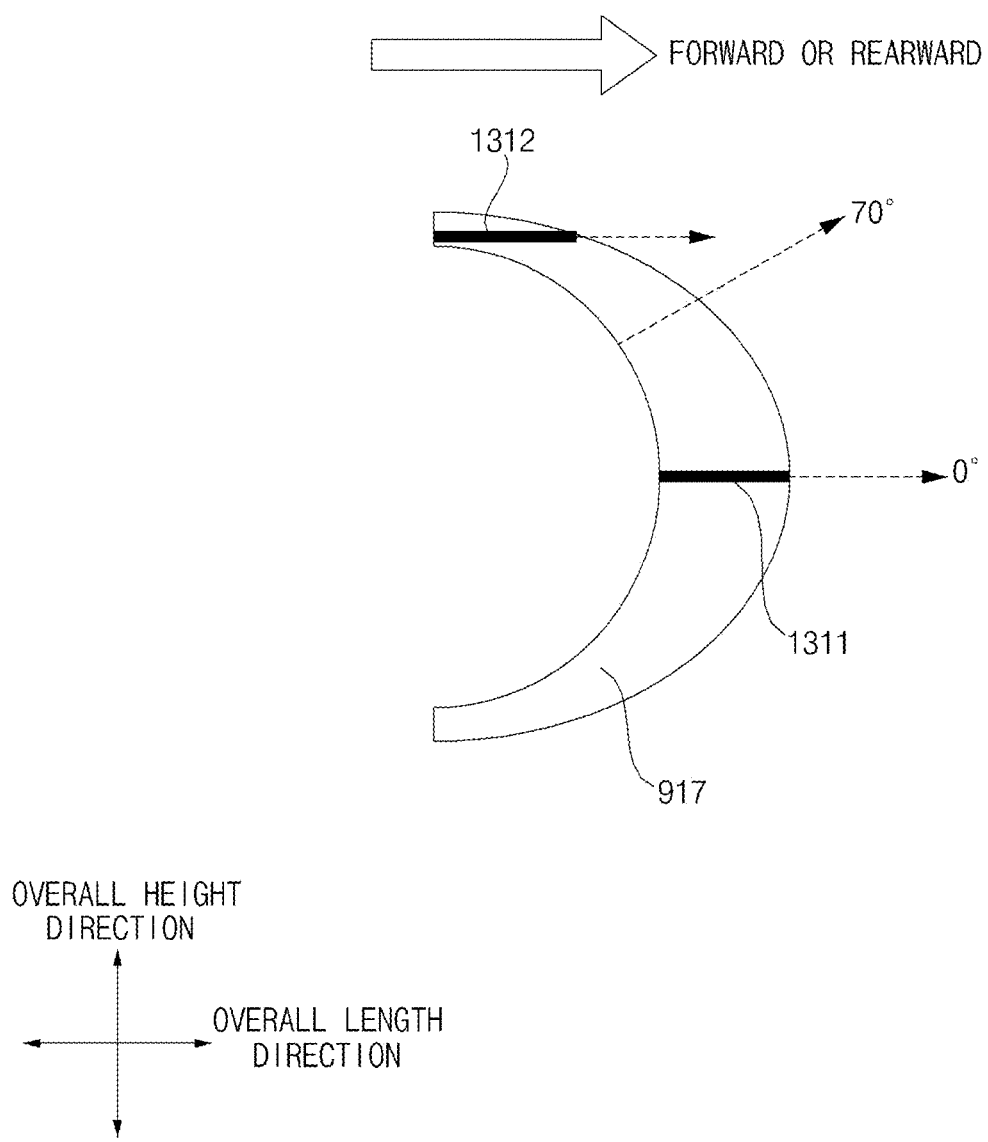

FIGS. 13A and 13B are diagrams illustrating an example phosphor layer of an example flexible array.

As described above, the flexible array 200 may include the phosphor layer 917.

The phosphor layer 917 may cover the plurality of groups of micro LED chips.

The flexible array 200 may include a first region 421 and a second region 422.

The first region 421 may be a region which is bent with a first curvature.

When viewed from the side, the first region 421 may be a region with a first angle range.

In the first region 421, a first micro LED chip 920c included in a first group and having a first shape may be disposed.

The second region 422 may be a region which is bent with a second curvature. The second curvature may be greater than the first curvature.

When viewed from the side, the second region 422 may be a region with a second angle range.

In the second region 422, a second micro LED chip 920d included in a second group and having a second shape may be disposed.

As illustrated in FIG. 13A, when the phosphor layer 917 has a constant thickness, a length (or an area/volume) 1301 which light output from the first region 421 travels to pass through the phosphor layer 917 is different from a length (or an area/volume) 1302 which light output from the second region 422 travels to pass through the phosphor layer 917.

In this case, the light output from the first region 421 and the light output from the second region respond to the phosphor layer 917 in different degrees, thereby resulting in non-uniformity of luminous intensity and color deviation.

As illustrated in FIG. 13B, the phosphor layer 917 may not have a constant thickness. In some examples, the phosphor layer 917 having non-uniform thickness may prevent discolored ring.

For example, the thickness of the phosphor layer 917 may be thinner from the center to the peripheral.

For example, the thickness of the phosphor layer 917 may be thicker from the peripheral to the center.

For example, the thickness of the phosphor layer 917 may be determined by a first curvature and a second curvature.

The phosphor layer 917 may include a first phosphor region and a second phosphor region.

The first phosphor region may change a wavelength of light generated by the first micro LED chip 920c included in the first group.

The second phosphor region may change a wavelength of light generated by the second micro LED chip 920d generated by the micro LED chip included in the second group.

A thickness of the first phosphor region may be thicker than a thickness of the second phosphor region.

A thickness of the second phosphor region may be thinner than a thickness of the first phosphor region.

If the phosphor layer 917 does not have a constant thickness, a length (or an area/volume) 1311 which light output from the first region 421 travels to pass through the phosphor layer 917 may be identical (or similar) to a length 1312 which light output from the second region 422 travels to pass through the phosphor layer 917.

In this case, the light output from the first region and the light output from the second region respond to the phosphor layer 917 in similar degrees, thereby resulting in uniformity of luminous intensity and minimizing color deviation. Accordingly, light distribution efficiency may improve.

Figure 14A:
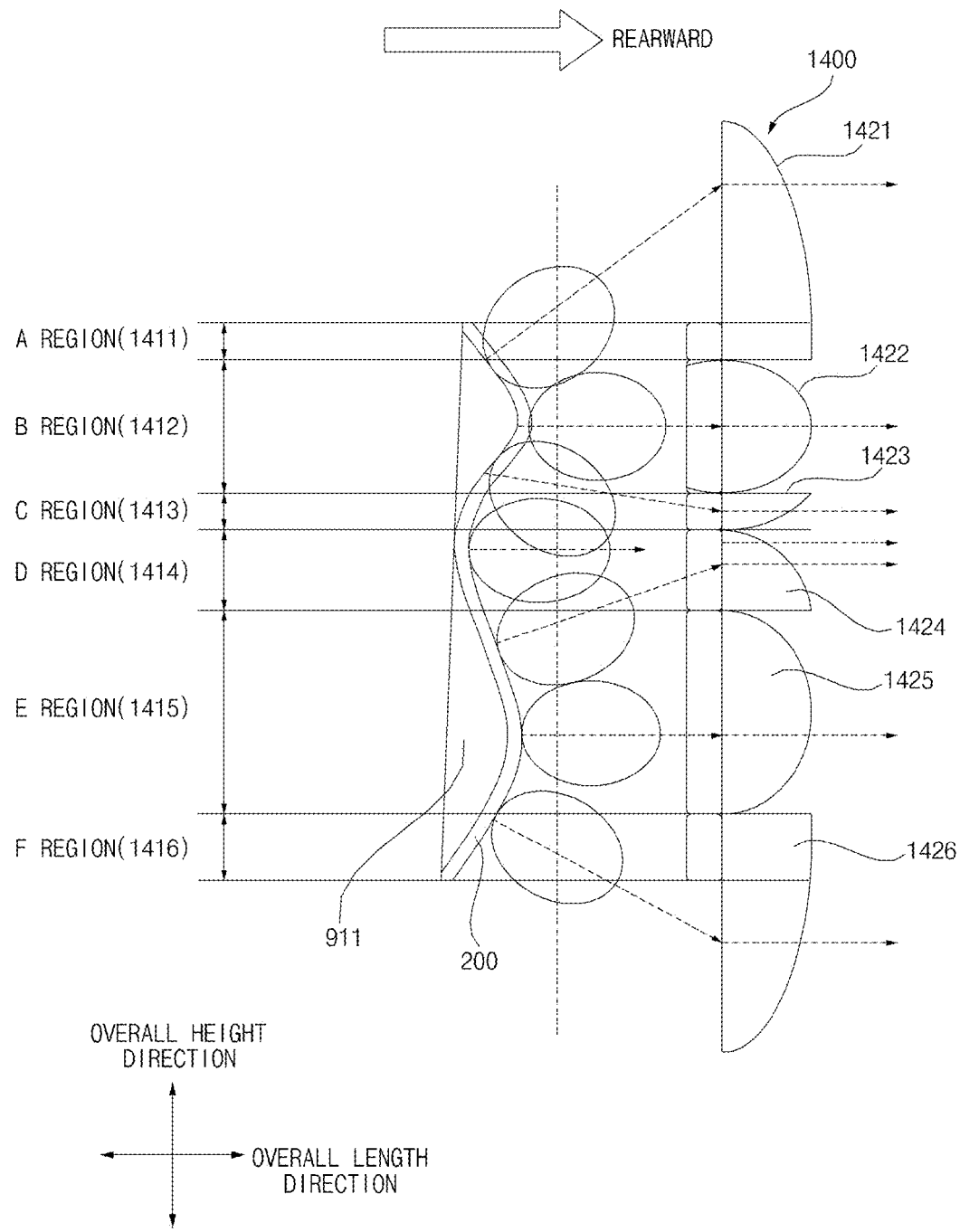
FIG. 14A is a diagram illustrating an example second lens.

FIG. 14A is a diagram illustrating an example second lens.

Referring to FIG. 14A, the lamp 100 may further include a second lens 1400.

The second lens 1400 may be disposed between a first lens 320 (see FIG. 3) and the light generation unit 160.

The second lens 1400 may be formed greater than the flexible array 200.

The second lens 1400 may have an optical shape which is formed based on bending of the flexible array 200.

For example, the second lens 1400 may have an optical shape which is formed based on a convex/concave shape and a curvature of the flexible array.

As illustrated in FIG. 14A, the flexible array 200 may include an A region 1411, a B region 1412, a C region 1413, a D region 1414, an E region 1415, and an F region 1416.

The first micro LED chips 920c may be disposed in the B region 1412 and the E region 1415.

The second micro LED chips 920d may be disposed in a first position in the A region 1411 and the D region 1414.

The second micro LED chips 920d may be disposed in a second position in the C region 1413 and the F region 1416. The second position may be a position horizontally symmetric to the first position.

The second lens 1400 may include a plurality of sub-lenses respectively corresponding to the flexible array 200 and the plurality of regions 1411, 1412, 1413, 1414, 1415, and 1416.

As illustrated in FIG. 14A, the second lens 1400 may include a first sub-lens 1421, a second sub-lens 1422, a third sub-lens 1423, a fourth sub-lens 1424, a fifth sub-lens 1425, and a sixth sub-lens 1426.

The first sub-lens 1421 may be a lens having a shape that corresponds to an upper lens portion which is convex in a direction rearward of the vehicle 10, so that light generated from the A region 1411 is directed rearward of the vehicle 10.

The second sub-lens 1422 may be a lens having a shape that corresponds to a lens which is convex in a direction rearward of the vehicle 10, so that light generated from the B region 1412 is directed rearward of the vehicle 10.

The third sub-lens 1423 may be a lens having a shape corresponding to a lower lens portion which is convex in a direction rearward of the vehicle 10, so that light generated from the C region 1413 is directed rearward of the vehicle The fourth sub-lens 1424 may be a lens having a shape that corresponds to an upper lens portion which is convex in a direction rearward of the vehicle 10, so that light generated from the region D 1414 is directed rearward of the vehicle 10.

The fifth sub-lens 1425 may be a lens which is convex in a direction rearward of the vehicle 10, so that light generated from the E region 1415 is directed rearward of the vehicle 10.

The sixth sub-lens 1426 may be a lens having a shape which corresponds to a lower lens portion which is convex in a direction rearward of the vehicle 10, so that light generated from the F region 1426 is directed rearward of the vehicle 10.

The optical shape of the second lens 1400 may be formed further based on shapes of a plurality of groups of micro LED chips.

For example, when a second micro LED chip 920d instead of a first micro LED chip 920c is disposed in a specific region, the second lens 1400 corresponding to the specific region becomes smaller in size in the overall height direction.

In some examples, the second lens 1400 may have the structure of Fresnel lens.

As the second lens 1400 has the structure of Fresnel lens, the second lens 1400 may be formed at a thin thickness.

FIG. 14B is a diagram illustrating an example light refracting layer and an air gap.

Referring to FIG. 14B, the lamp may further include a light refracting layer 1440 and an air gap 1430.

The light refracting layer 1440 may be formed of a medium which has a refractive index greater than that of air.

For example, the light refracting layer 1440 may have refractive index 1.4 to 2.0.

The light refracting layer 1440 may be formed of a transparent material.

For example, the light refracting layer 1440 may be formed of a plastic silicon or a polymer.

The light refracting layer 1440 may be bent based on bending of the flexible array 200.

For example, the light refracting layer 1440 may have a bent shape similar to a bent shape of the flexible array 200.

The light refracting layer 1440 may not have a constant thickness.

The light refracting layer 1440 may include a plurality of regions. The plurality of regions may have different thicknesses.

For example, the light refracting layer 1440 may include first to sixth regions 1441 to 1446 respectively corresponding to the A to F regions 1411 to 1416.

A thickness of the first region 1411 may be greater than a thickness of the region 1442.

The greater thickness of the light refracting layer 1440, the more the optical path is changed. Thus, by forming the first region 1441 at a thickness greater than a thickness of the second region, it is possible to increase light intensity.

The air gap 1430 may be formed between the light generation unit 160 and the light refracting layer 1440.

The light refracting layer 1440 and the light generation unit 160 may function as the second lens 1400 shown in FIG. 14A.

The present disclosure as described above may be implemented as code that can be written on a computer-readable medium in which a program is recorded and thus read by a computer. The computer-readable medium includes all kinds of recording devices in which data is stored in a computer-readable manner. Examples of the computer-readable recording medium may include a hard disk drive (HDD), a solid state disk (SSD), a silicon disk drive (SDD), a read only memory (ROM), a random access memory (RAM), a compact disk read only memory (CD-ROM), a magnetic tape, a floppy disc, and an optical data storage device. In addition, the computer-readable medium may be implemented as a carrier wave (e.g., data transmission over the Internet). In addition, the computer may include a processor or a controller. Thus, the above detailed description should not be construed as being limited to the implementations set forth herein in all terms, but should be considered by way of example. The scope of the present disclosure should be determined by the reasonable interpretation of the accompanying claims and all changes in the equivalent range of the present disclosure are intended to be included in the scope of the present disclosure.

Although implementations have been described with reference to a number of illustrative implementations thereof, it should be understood that numerous other modifications and implementations can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A lamp for a vehicle, comprising:
   a light generation unit; and
   a first lens configured to change an optical path of light generated by the light generation unit,
   wherein the light generation unit comprises a flexible array, and a plurality of groups of micro Light Emitting Diode (LED) chips disposed on the flexible array,
   wherein the plurality of groups of micro LED chips comprises a first group of micro LED chips and a second group of micro LED chips, and
   wherein a shape of a first micro LED chip in the first group of micro LED chips is different from a shape of a second micro LED chip in the second group of micro LED chips.

2. The lamp according to claim 1, wherein the first group of micro LED chips are configured to output light in a first direction, and
   wherein the second group of micro LED chips are configured to output light in a second direction that is different from the first direction.

3. The lamp according to claim 1, wherein the flexible array is divided into a plurality of regions according to a bending curvature of each region, the plurality of regions comprising a first region and a second region, and
   wherein a shape of a micro LED chip in the first region is different from a shape of a micro LED chip in the second region.

4. The lamp according to claim 3, wherein the first region is curved to have a first curvature, and the second region is curved to have a second curvature that exceeds the first curvature.

5. The lamp according to claim 4, wherein the first micro LED chip in the first group of micro LED chips has a first shape and is disposed in the first region, and
   wherein the second micro LED chip in the second group of micro LED chips has a second shape and is disposed in the second region.

6. The lamp according to claim 5, wherein the second micro LED chip in the second group of micro LED chips comprises a body, and a reflective layer disposed on the body.

7. The lamp according to claim 6, wherein a side surface of the body forms a tilting angle with respect to a direction perpendicular to the reflective layer.

8. The lamp according to claim 7, wherein the tilting angle is determined according to the second curvature.

9. The lamp according to claim 1, wherein the flexible array comprises a phosphor layer that covers the plurality of groups of micro LED chips.

10. The lamp according to claim 9, wherein a thickness of the phosphor layer is thinner at a center of the phosphor layer than a periphery of the phosphor layer.

11. The lamp according to claim 10, wherein the flexible array further comprises:
    a first region that is curved to have a first curvature; and
    a second region that is curved to have a second curvature that exceeds the first curvature, and
    wherein the thickness of the phosphor layer is determined based on the first curvature and the second curvature.

12. The lamp according to claim 11, wherein the first micro LED chip in the first group of micro LED chips has a first shape and is disposed in the first region,
    wherein the second micro LED chip in the second group of micro LED chips has a second shape and is disposed in the second region,
    wherein the phosphor layer comprises:
        a first phosphor area configured to change a wavelength of light generated by the first micro LED chip included in the first group, and
        a second phosphor area configured to change a wavelength of light generated by the second micro LED chip included in the second group, and
    wherein a thickness of the first phosphor area is greater than a thickness of the second phosphor area.

13. The lamp according to claim 1, further comprising a second lens disposed between the first lens and the light generation unit, the second lens having an optical shape determined according to a bent shape of the flexible array.

14. The lamp according to claim 13, wherein the optical shape of the second lens is determined further based on shapes of the plurality of groups of micro LED chips.

15. The lamp according to claim 13, wherein the optical shape of the second lens is convex or concave based on a curvature of the flexible array.

16. The lamp according to claim 1, further comprising:
    a light refracting layer that comprises a medium having a refractive index greater than a refractive index of air; and
    an air gap defined between the light generation unit and the light refracting layer.

17. The lamp according to claim 16, wherein the light refracting layer is curved according to a bent shape of the flexible array.

18. The lamp according to claim 1, wherein the flexible array comprises a plurality of sub-arrays, and
wherein each group of the plurality of groups of micro LED chips is disposed on a sub-array among the plurality of sub-arrays.

19. The lamp according to claim 18, wherein the sub-array has a different shape from a shape of a second sub-array among the plurality of sub-arrays.

20. A vehicle comprising the lamp according to claim 1.

* * * * *